(12) United States Patent
Park et al.

(10) Patent No.: US 12,138,667 B2
(45) Date of Patent: Nov. 12, 2024

(54) APPARATUS FOR TREATING SUBSTRATE

(71) Applicant: SEMES CO., LTD., Cheonan-si (KR)

(72) Inventors: Shi Hyun Park, Seoul (KR); In Hwang Park, Cheonan-si (KR); Seung Eun Na, Bucheon-si (KR); Eun Woo Jang, Seoul (KR); Kyung Min Kim, Daegu (KR); Je Myung Cha, Busan (KR)

(73) Assignee: SEMES CO., LTD., Cheonan-si (KR)

( * ) Notice: Subject to any disclaimer, the term of this patent is extended or adjusted under 35 U.S.C. 154(b) by 266 days.

(21) Appl. No.: 17/691,215

(22) Filed: Mar. 10, 2022

(65) Prior Publication Data

US 2022/0297167 A1    Sep. 22, 2022

(30) Foreign Application Priority Data

Mar. 22, 2021 (KR) .................. 10-2021-0036637

(51) Int. Cl.
*H01L 21/02* (2006.01)
*B08B 3/08* (2006.01)
*H01L 21/67* (2006.01)

(52) U.S. Cl.
CPC .......... *B08B 3/08* (2013.01); *H01L 21/02041* (2013.01); *H01L 21/67051* (2013.01)

(58) Field of Classification Search
CPC ................ B08B 3/08; H01L 21/02041; H01L 21/67051; H01L 21/67017; H01L 21/67253; H01L 21/67259; B01D 46/44
See application file for complete search history.

(56) References Cited

U.S. PATENT DOCUMENTS 7,279,049 B2    10/2007  Kaszuba et al.
2014/0137893 A1*  5/2014  Otsuka .............. H01L 21/67028
                                            134/30
(Continued)

FOREIGN PATENT DOCUMENTS

CN        104517870         4/2015
JP       2013187395 A   *   9/2013
(Continued)

OTHER PUBLICATIONS

Machine translation of KR 20130025133 A (Year: 2013).*
(Continued)

*Primary Examiner* — Erin F Bergner

(57) ABSTRACT

The inventive concept provides a substrate treating apparatus. The substrate treating apparatus includes a housing having an inner space therein; a treating container disposed within the inner space and having a treating space; a substrate support unit supporting a substrate in the treating space; a liquid supply unit supplying a liquid to the substrate supported by the substrate support unit; an exhaust unit exhausting a fume generated in the treating space; an airflow supply unit coupled to a top side of the housing and supplying a gas to form a downward airflow to the inner space; and a perforated plate disposed between the treating container and the airflow supply unit and discharging the gas to the inner space, and wherein the perforated plate comprises: a bottom portion and a side portion, the side portion comprising a first side portion, and the first side portion extending and upwardly inclining from the bottom portion to a first sidewall of the housing, and having a first hole for discharging the gas.

19 Claims, 15 Drawing Sheets

(56) References Cited

U.S. PATENT DOCUMENTS

| | | |
|---|---|---|
| 2015/0090305 A1 | 4/2015 | Wakiyama et al. |
| 2018/0122676 A1 | 5/2018 | Kong et al. |
| 2019/0172732 A1* | 6/2019 | Naohara ........... H01L 21/02057 |
| 2021/0013064 A1 | 1/2021 | Yoon et al. |

FOREIGN PATENT DOCUMENTS

| | | | | |
|---|---|---|---|---|
| JP | 2014175581 | | 9/2014 | |
| JP | 2015088734 | | 5/2015 | |
| JP | 2019102653 | | 6/2019 | |
| JP | 2021015977 | | 2/2021 | |
| KR | 1020100018456 | | 2/2010 | |
| KR | 101895410 | | 3/2013 | |
| KR | 20130025133 A | * | 3/2013 | |
| KR | 10-2014-0132601 | | 11/2014 | |
| KR | 10-2018-0049289 | | 5/2018 | |
| KR | 10-2019-0066553 | | 6/2019 | |
| KR | 102000545 | | 7/2019 | |
| KR | 20200134633 A | * | 12/2020 | ............. H01L 21/67 |
| KR | 20210075931 | | 6/2021 | |
| WO | 03034463 | | 4/2003 | |

OTHER PUBLICATIONS

Machine translation of KR 20200134633 A (Year: 2020).*
Machine translation of JP 2013187395 A (Year: 2013).*
Office Action from the Korean Intellectual Property Office dated Apr. 11, 2023.
Office Action from the Japan Patent Office dated Apr. 18, 2023.
Office Action from the Taiwan Intellectual Property Office dated Sep. 30, 2022.

\* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2021-0036637 filed on Mar. 22, 2021, in the Korean Intellectual Property Office, the entire contents of which are hereby incorporated by reference.

BACKGROUND

Embodiments of the inventive concept described herein relate to a substrate treating apparatus, and more specifically to a substrate treating apparatus supplying a downward air flow to an inner space of a housing.

Various processes such as a photolithography process, a thin film deposition process, an ashing process, an etching process, and an ion implantation process are carried out to manufacture a semiconductor device. Also, a cleaning process for a cleaning treatment of remaining particles on the substrate is performed before and after each of the processes is performed. The substrate treating process is performed with various liquid at the cleaning process of the substrate.

The cleaning process includes a process of supplying a chemical to the substrate supported and rotated by a spin head, a process of removing the chemical from the substrate by supplying a cleaning liquid such as a deionized water (DIW) to the substrate, and afterwards, a process of replacing the cleaning liquid on the substrate with an organic solvent by supplying an organic solvent such as an isopropyl alcohol (IPA) solution having a lower surface tension than the cleaning solution, and a process of removing the substituted organic solvent from the substrate.

FIG. 1 is a cross-sectional view illustrating a conventional substrate treating apparatus. Referring to FIG. 1, the substrate treating apparatus 1000 is provided with a treating container 1200 surrounding a support unit 1100 supporting the substrate in a housing, and treats the substrate while supplying a liquid to a rotating substrate. A fan filter unit 1300 is provided to provide a downward airflow to an inner space of the housing in order to easily discharge a gas generated during a substrate treating process. Particles, a fume, a gas, etc. generated when the substrate is treated with each treating liquid in the inner space are discharged to the outside together with the downward air flow through an exhaust device. Since the fan filter unit is installed at a position opposite to the treating container, the airflow is stagnated near a sidewall of the housing. As a result, an exhaust to the exhaust device is not smooth, and thus the gas generated during the substrate treatment is attached to the substrate to form particles in the substrate.

SUMMARY

Embodiments of the inventive concept provide a substrate treating apparatus capable of removing an airflow congestion due to a downward airflow in an inner space of a housing when treating a substrate while providing the downward airflow to the inner space of the housing.

Embodiments of the inventive concept provide a substrate treating apparatus that prevents particles from being formed on a substrate when treating the substrate while providing the downward airflow to an inner space of a housing.

The technical objectives of the inventive concept are not limited to the above-mentioned ones, and the other unmentioned technical objects will become apparent to those skilled in the art from the following description.

According to an embodiment of the present invention, a substrate treating apparatus includes a housing having an inner space therein; a treating container disposed within the inner space and having a treating space; a substrate support unit supporting a substrate in the treating space; a liquid supply unit supplying a liquid to the substrate supported by the substrate support unit; an exhaust unit exhausting a byproduct generated in the treating space from a cleaning process using the liquid; an airflow supply unit coupled to a top side of the housing and supplying a downward airflow of a gas to the inner space; and a perforated plate disposed between the treating container and the airflow supply unit and discharging the gas to the inner space. The perforated plate comprises a bottom portion and a side portion. The side portion comprises a first side portion, and the first side portion extending in an upwardly inclined direction from the bottom portion to a first sidewall of the housing, and having a first hole for discharging the gas.

According to an embodiment of the present invention, a substrate treating apparatus includes a housing having an inner space and including a first sidewall and a second sidewall; a treating container disposed within the inner space and having a treating space; a substrate support unit supporting a substrate in the treating space; a liquid supply unit supplying a liquid to the substrate supported by the substrate support unit; an exhaust unit exhausting a byproduct generated in the treating space from a cleaning process using the liquid; an airflow supply unit coupled to a top side of the housing and supplying a gas to form a downward airflow to the inner space; and a perforated plate disposed between the treating container and the airflow supply unit, and discharging the gas to the inner space, and wherein the perforated plate comprises: a bottom portion having bottom holes for discharging the gas in a direction perpendicular to a top surface of the substrate supported by the support unit; and a first side portion extending upwardly from the bottom portion to the first sidewall of the housing, and having first holes for discharging the gas toward the first sidewall of the housing.

According to an embodiment of the present invention, a substrate treating apparatus comprises: a housing having an inner space and including a first sidewall, a second sidewall, a third sidewall, and a fourth sidewall; a treating container disposed within the inner space and having a treating space; a substrate support unit supporting a substrate in the treating space; a liquid supply unit supplying a liquid to the substrate supported by the substrate support unit; an exhaust unit exhausting a byproduct generated in the treating space; an airflow supply unit coupled to a top side of the housing and supplying a gas to form a downward airflow to the inner space; and a perforated plate disposed between the treating container and the airflow supply unit, and discharging the gas to the inner space. The perforated plate comprises: a bottom portion including a plurality of bottom holes for discharging the gas in a direction perpendicular to a top surface of the substrate supported by the substrate support unit; and a first side portion upwardly extending from the bottom portion to the first sidewall of the housing, and having a plurality of first holes for discharging the gas toward the first sidewall of the housing.

According to an embodiment of the inventive concept, when a substrate is treated while providing a downward airflow to an inner space of a housing, it is possible to prevent the airflow from being stagnated in an inner space of the housing.

According to an embodiment of the inventive concept, it is possible to prevent particles from being formed on a substrate when treating the substrate while providing a downward airflow to an inner space of the housing.

According to an embodiment of the inventive concept, in a structure provided with a perforated plate for providing a downward airflow, a space in which an imaging unit is installed may be provided and at the same time, the downward airflow may be provided to an entire inner space of a housing.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
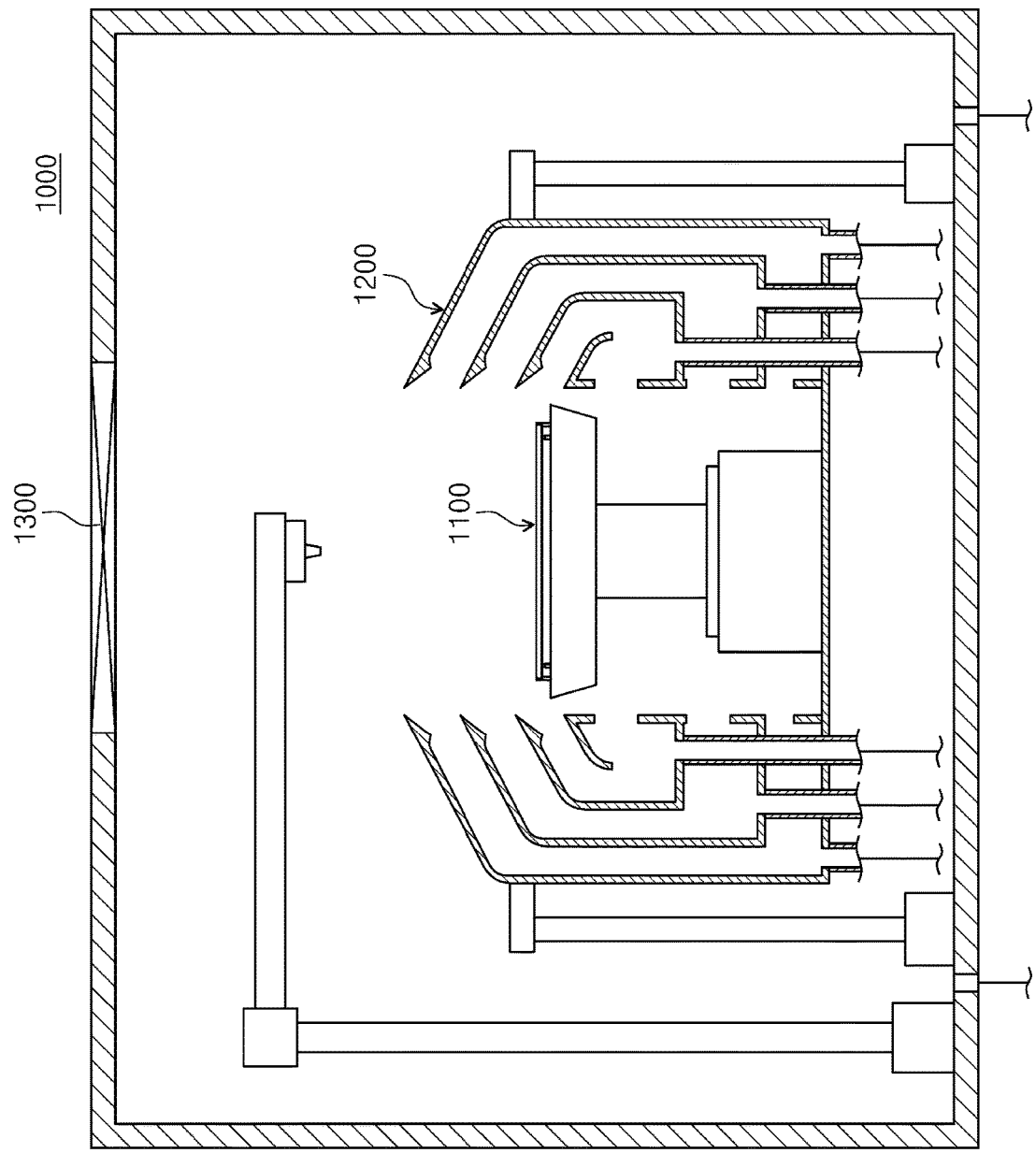
FIG. 1 is a cross-sectional view schematically illustrating a process chamber of a conventional substrate treating apparatus.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

In an embodiment of the inventive concept, a process of liquid-treating a substrate by supplying a liquid such as a cleaning liquid onto the substrate will be described as an example. However, the embodiment is not limited to a cleaning process, and may be applied to various processes for treating the substrate using a treating liquid such as an etching process, an ashing process, a developing process, and the like.

Hereinafter, an embodiment of the inventive concept will be described in detail with reference to FIG. 2 to FIG. 16.

Figure 2:
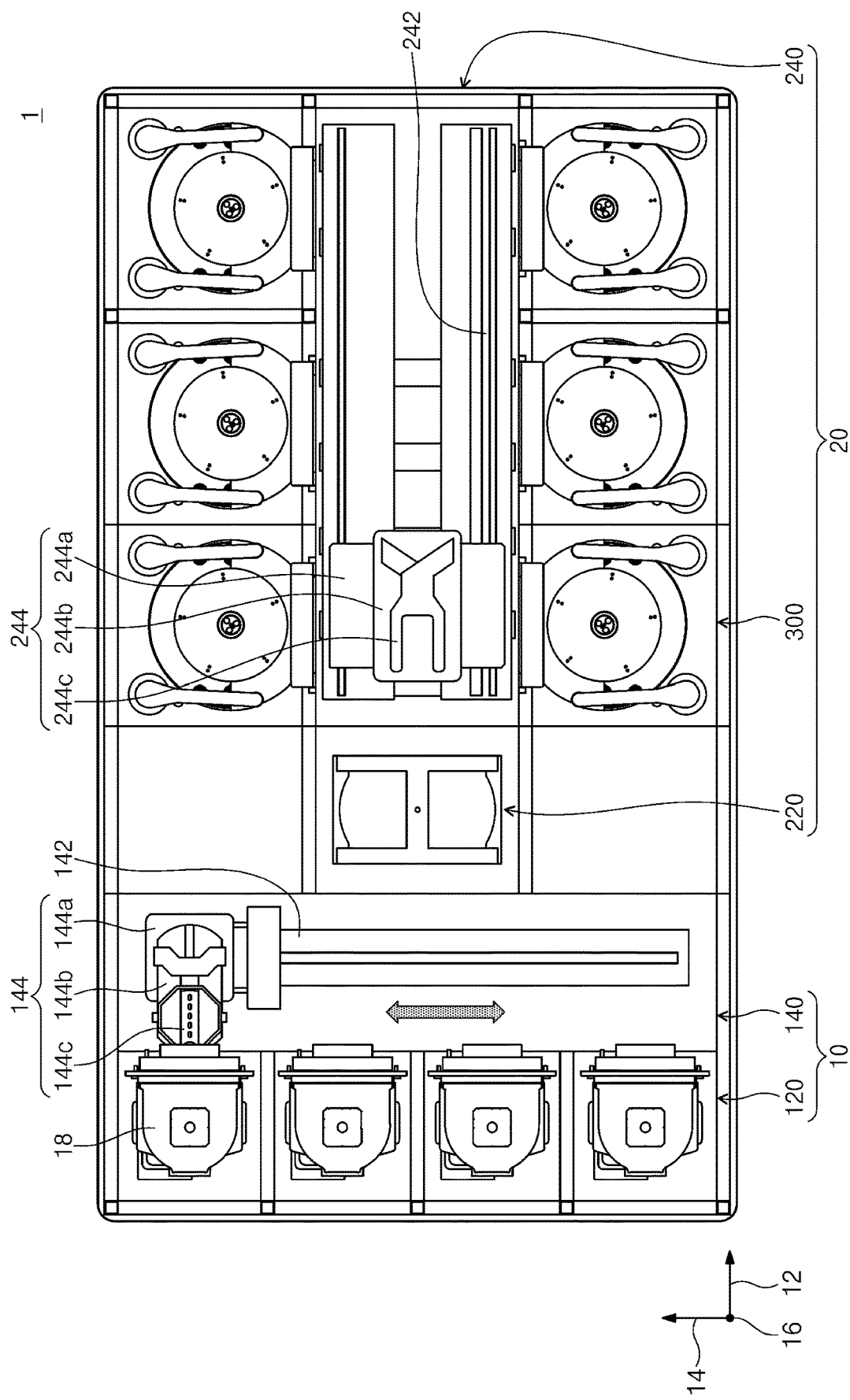
FIG. 2 is a plan view schematically illustrating a substrate treating apparatus according to an embodiment of the inventive concept.

FIG. 2 is a plan view schematically illustrating a substrate treating apparatus according to an embodiment of the inventive concept. Referring to FIG. 2, the substrate treating apparatus 1 includes an index module 10 and a processing module 20. The index module 10 has a load port 120 and a transfer frame 140. The load port 120, the transfer frame 140, and the processing module 20 are sequentially arranged in a direction. Hereinafter, the direction in which the load port 120, the transfer frame 140, and the processing module 20 are arranged is referred to as a first direction 12, a direction perpendicular to the first direction 12 is referred to as a second direction 14, and a direction perpendicular to a plane including the first direction 12 and the second direction 14 is referred to as a third direction 16.

A container 130 in which the substrate W is stored is seated in the load port 120. A plurality of load ports 120 are provided and arranged along the second direction 14. The number of load ports 120 may increase or decrease according to a process efficiency and foot print conditions of the processing module 20. A plurality of slots (not shown) for holding the substrates W horizontally are formed in the container 130. A front opening unified pod (FOUP) may be used as the container 130.

The processing module 20 includes a buffer unit 220, a transfer chamber 240, and a process chamber 300. The transfer chamber 240 is disposed with its lengthwise direction parallel to the first direction 12. A plurality of process chambers 300 are disposed on both sides of the transfer chamber 240, respectively. At one side and the other side of the transfer chamber 240, the process chambers 300 are provided to be symmetrical with respect to the transfer chamber 240. Some of the plurality of the process chambers 300 are disposed along the longitudinal direction of the transfer chamber 240, i.e., along the first direction 12. In addition, some of the plurality of process chambers 300 are disposed to be stacked on each other, i.e., along the third direction 16. That is, process chambers 260 may be arranged in an arrangement of AXB on one side and/or the other side of the transfer chamber 240. Here, A is the number of process chambers 300 provided along the first direction 12, and B is the number of process chambers 300 provided along the third direction 16. When four or six process chambers 300 are provided on one side of the transfer chamber 240, the process chambers 300 may be arranged in an arrangement of 2×2 or 3×2. The number of process chambers 300 may increase or decrease. The process chamber 300 may be provided only on one side of the transfer chamber 240. In addition, the process chamber 300 may be provided in a single layer (without stacking each other along the third direction) on one side and/or both sides of the transfer chamber 240.

The buffer unit 220 is disposed between the transfer frame 140 and the transfer chamber 240. The buffer unit 220 provides a space in which the substrate W stays before the substrate W is transferred between the transfer chamber 240 and the transfer frame 140. A slot (not shown) in which the substrate W is held thereon is provided inside the buffer unit 220. A plurality of slots (not shown) are provided to be spaced apart from each other along the third direction 16. A side of the buffer unit 220 facing the transfer frame 140 and a side facing the transfer chamber 240 are opened. The two open sides of the buffer unit 220 may be two opposite sides thereof.

The transfer frame 140 transfers the substrate W between the container 130 seated on the load port 120 and the buffer unit 220. The transfer frame 140 is provided with an index rail 142 and an index robot 144. The index rail 142 is provided such that its lengthwise direction is parallel to the second direction 14. The index robot 144 is installed on the index rail 142 and is linearly moved in the second direction 14 along the index rail 142. The index robot 144 has a base 144a, a body 144b, and an index arm 144c. The base 144a is installed to be movable along the index rail 142. The body 144b is coupled to the base 144a. The body 144b is provided to be movable along the third direction 16 on the base 144a. In addition, the body 144b is provided to be rotatable on the base 144a. The index arm 144c is coupled to the body 144b and is provided to be able to be forwardly and backwardly movable with respect to the body 144b. A plurality of index arms 144c are provided to be individually driven. The index arms 144c are disposed to be stacked while being spaced apart from each other in the third direction 16. Some of the index arms 144c may be used to transport the substrate W from the processing module 20 to the container 130, and some of the other index arms 144c may be used to transport the substrate W from the container 130 to the processing module 20. This may prevent particles generated from the substrate W before processing from being attached to the substrate W after processing in a process of bringing in and taking out the substrate W by the index robot 144.

The transfer chamber 240 transfers the substrate W between the buffer unit 220 and the process chamber 300 and between the process chambers 300. The transfer chamber 240 is provided with a guide rail 242 and a main robot 244. The guide rail 242 is provided such that its lengthwise direction is parallel to the first direction 12. The main robot 244 is installed on the guide rail 242 and is linearly moved along the first direction 12 on the guide rail 242. The main robot 244 has a base 244a, a body 244b, and a main arm 244c. The base 244a is installed to be movable along the guide rail 242. The body 244b is coupled to the base 244a. The body 244b is provided to be movable along the third direction 16 on the base 244a. In addition, the body 244b is provided to be rotatable on the base 244a. The main arm 244c is coupled to the body 244b, which is provided to be forwardly and backwardly movable with respect to the body 244b. A plurality of main arms 244c are provided to be individually driven. The main arms 244c are disposed to be stacked while being spaced apart from each other in the third direction 16.

The process chamber 300 may be a liquid treatment chamber that supplies a liquid to the substrate W to perform a liquid treatment process. For example, the liquid treatment process may be a cleaning process of cleaning the substrate with a cleaning solution. A chemical treatment, a rinse treatment, and a drying treatment may all be performed on the substrate within the process chamber. In some embodiments, a drying chamber for drying the substrate may be provided separately from the liquid treatment chamber.

Figure 3:
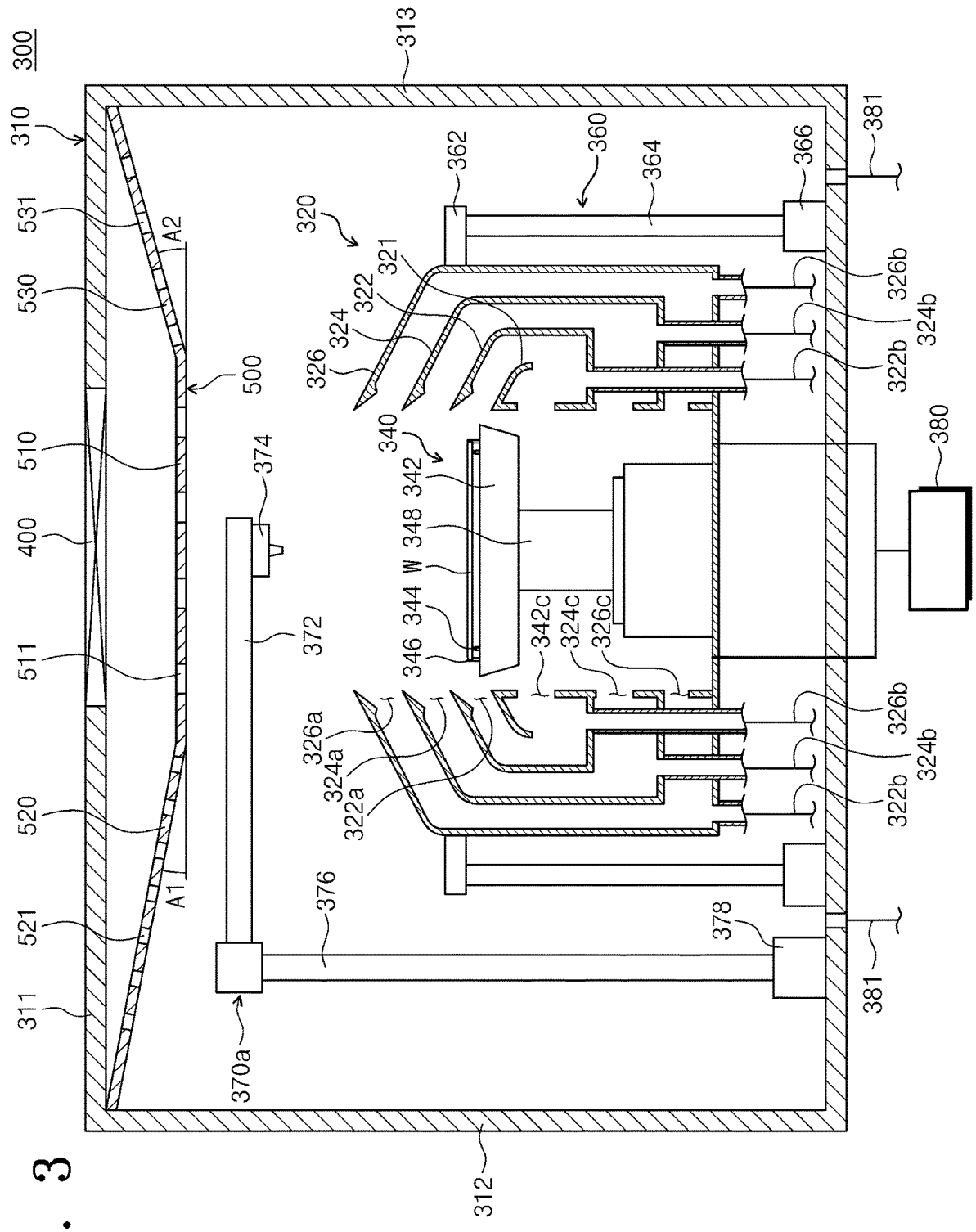
FIG. 3 is a view schematically illustrating an embodiment of a process chamber of the substrate treating apparatus of FIG. 2.
Figure 4:
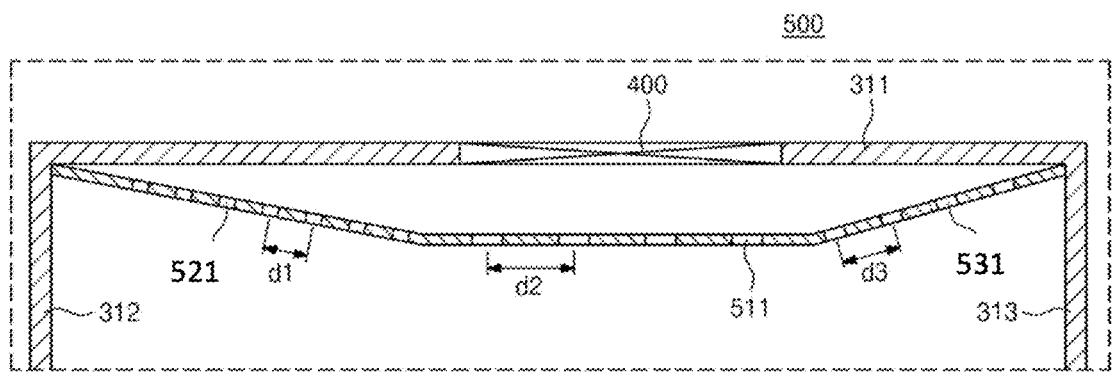
FIG. 4 is a view of a perforated plate of FIG. 3 viewed from a front of the process chamber.
Figure 5:
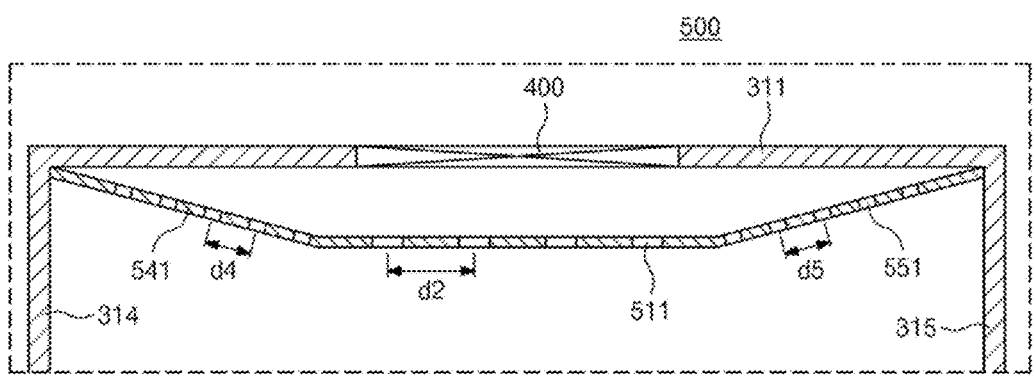
FIG. 5 is a view of the perforated plate of FIG. 3 viewed from a side of the process chamber.

FIG. 3 is a cross-sectional view schematically illustrating an embodiment of the process chamber of FIG. 2. FIG. 4 and FIG. 5 schematically shows the perforated plate of FIG. 3 viewed from a front and from a side of the process chamber, respectively. Referring to FIG. 3 to FIG. 5, the process chamber 300 includes a housing 310, a treating container 320, a substrate support unit 340, a liquid supply unit 370, an exhaust unit 380, an airflow supply unit 400, and a perforated plate 500.

The housing 310 forms a space therein. The housing 310 has a top wall 311, a bottom wall, and sidewalls defining the space. According to an embodiment, the housing 310 generally has a rectangular parallelepiped shape, and thus the housing may have a first sidewall 312, a second sidewall 313, a third sidewall 314, and a fourth sidewall 315. The first sidewall 312 and the second sidewall 313 are opposing each other, and the third sidewall 314 and the fourth sidewall 315 are opposing each other. A shortest distance from the first sidewall 312 to the substrate may be greater than a shortest distance from the second sidewall 313, the third sidewall 314, and the fourth sidewall 315 to the substrate.

The treating container 320 is located inside the housing 310. The treating container 320 has a treating space for treating the substrate W. The treating container 320 has a guide wall 321, an inner recollecting container 322, a middle recollecting container 324, and an outer recollecting container 326. Each of the recollecting containers 322, 324, and 326 separates and recovers different treating liquids among the treating liquids used in the process. The guide wall 321 is provided in an annular ring shape surrounding the substrate support unit 340, and the inner recollecting container 322 is provided in an annular ring shape surrounding the guide wall 321. The middle recollecting container 324 is provided in an annular ring shape surrounding the inner recollecting container 322, and the outer recollecting container 326 is provided in an annular ring shape surrounding the middle recollecting container 324. A space 322a between the inner recollecting container 322 and the guide wall 321 functions as a first inlet through which the treating liquid is introduced. A space 324a between the inner recollecting container 322 and the middle recollecting container 324 functions as a second inlet through which the treating liquid is introduced. A space 326a between the middle recollecting container 324 and the outer recollecting container 326 functions as a third inlet through which the treating liquid is introduced. In addition, a space 322c between a bottom end of the guide wall 321 and the inner recollecting container 322 functions as a first outlet through which a byproduct (e.g., a fume) and an air flow generated from the treating liquid are discharged. A space 324c between a bottom end of the inner recollecting container 322 and the middle recollecting container 324 functions as a second outlet through which the fume and the airflow generated from the treating liquid are discharged. A space 326c between a bottom end of the middle recollecting container 324 and the outer recollecting container 326 functions as a third outlet through which the fume and the airflow generated from the treating liquid are discharged. Different types of treating liquids may be introduced into each recollecting container. To each of the recollecting containers 322, 324, and 326, recollecting lines 322b, 324b, and 326b extending downwardly from the respective bottom side are connected. Each of the recollecting lines 322b, 324b, and 326b discharges the treating liquid, the fume, and the air flow introduced through each of the recollecting containers 322, 324 and 326. The discharged treating liquid may be reused through an outer treating liquid regeneration system (not shown).

The substrate support unit 340 supports the substrate W and rotates the substrate W during the process. The substrate support unit 340 has a body 342, a support pin 344, a chuck pin 346, a support shaft 348, and a driving unit (not shown). The body 342 has a top surface that is generally provided in a circular shape when viewed from above. The support shaft 348 is fixedly coupled to a bottom surface of the body 342, and the support shaft 348 is provided to be rotatable by the driving unit 349.

A plurality of support pins 344 are provided. The support pins 344 are disposed on an edge of a top surface of the body 342 to be spaced apart from each other by a predetermined distance and protrude upward from the body 342. The support pins 344 are disposed to have an annular ring shape as a whole. The support pin 344 supports a rear edge of the substrate W so that the substrate W is spaced apart from the top surface of the body 342 by a predetermined distance.

A plurality of chuck pins 346 are provided. The chuck pin 346 is disposed farther from a center of the body 342 than the support pin 344 is. The chuck pin 346 is provided to upwardly protrude from the body 342. The chuck pin 346 supports a side part of the substrate W so as not to be laterally deviated from a predetermined position when the substrate W is rotated. The chuck pin 346 is provided to be able to linearly move between a standby position and a support position along a radial direction of the body 342. The standby position is a position far away from the center of the body 342 compared to the support position. When the substrate W loads or unloads on the substrate support unit 340, the chuck pin 346 is located at the standby position, and when performing a process on the substrate W, the chuck pin 346 is located at the support position. At the support position, the chuck pin 346 is in contact with the side part of the substrate W.

The lifting/lowering unit 360 linearly moves the treating container 320 in an up/down direction. As the treating container 320 is moved up and down, a relative height of the treating container 320 with respect to the substrate support unit 340 (i.e., a spin head) is changed. The lifting/lowering unit 360 has a bracket 362, a moving shaft 364, and a driver 366. The bracket 362 is fixedly installed on an outer wall of the treating container 320, and the moving shaft 364 moved in the up/down direction by the driver 366 is fixedly coupled to the bracket 362. When the substrate W is placed on the substrate support unit 340 or lifted from the substrate support unit 340, the treating container 320 is lowered so that the substrate support unit 340 upwardly protrudes from the treating container 320. In addition, for treating process, a height of the treating container 320 is adjusted so that the treating liquid may flow into a predetermined recollecting container according to the type of treating liquid supplied to the substrate W. In some embodiments, the lifting/lowering unit 360 may move the substrate support unit 340 in the up/down direction.

The liquid supply unit 370 supplies the treating liquid onto the substrate W. A plurality of liquid supply units 370 are provided, each supplying different types of treating liquids. According to an embodiment, the liquid supply unit 370 includes a first treating liquid supply member 370a and a second treating liquid supply member 370b.

The first treating liquid supply member 370a includes a support shaft 376, an arm 372, a driver 378, and a nozzle 374. The support shaft 376 is located on a side of the treating container 320. The support shaft 376 has a rod shape extending along the third direction. The support shaft 376 is provided to be rotatable by the driver 378. The arm 372 is coupled to a top end of the support shaft 376. The arm 372 vertically extends from the support shaft 376. The nozzle 374 is fixedly coupled to an end of the arm 372. As the support shaft 376 is rotated, the nozzle 374 may swing together with the arm 372. The nozzle 374 may swing and be moved to a process position and a standby position. Here, the process position is a position where the nozzle 374 faces the substrate W supported by the substrate support unit 340, and the standby position is a position where the nozzle 374 deviates from the process position.

In some embodiments, the arm 372 may be provided to be able to forwardly and backwardly move in its lengthwise direction. When viewed from above, the nozzle 374 may swing to be located on a central axis of the substrate W.

The second treating liquid supply member 370b supplies the second treating liquid onto the substrate W supported by the substrate support unit 340. The second treating liquid supply member 370b is provided to have the same shape as the first treating liquid supply member 370a. Accordingly, a detailed description of the second treating liquid supply member 370b will be omitted.

The first treating liquid and the second treating liquid may be any one of a chemical, a rinse liquid, and an organic solvent. The chemical may include a nitric acid, a phosphoric acid, or a sulfuric acid. The rinse liquid may contain a water. The organic solvent may include an alcohol such as an isopropyl alcohol.

The exhaust unit 380 exhausts the fume and the gas generated in the treating space. The exhaust unit 380 exhausts the fume and the gas generated during a liquid treatment of the substrate. The exhaust unit 380 may be coupled to a bottom surface of the treating container 320.

The exhaust duct 381 exhausts the fume and the gas generated in the inner space of the housing 310. The exhaust duct 381 exhausts the fume and the gas scattered from the treating space during the liquid treatment of the substrate. The exhaust duct 381 may be coupled to a bottom wall of the housing 310.

During the liquid treatment of the substrate, the fume and the gas may be exhausted only through the exhaust unit 380 of the exhaust unit 380 and the exhaust duct 381. In some embodiments, during the liquid treatment of the substrate, the fume and the gas may be simultaneously exhausted through the exhaust unit 380 and the exhaust duct 381. In this case, the exhaust duct 381 may be controlled such that an exhaust pressure thereof is to be lower than an exhaust pressure of the exhaust unit 380 when the substrate is subjected to the liquid treatment, thereby exhausting a smaller amount as compared to the exhaust unit 380. For this reason, it is possible to prevent the fume generated in the treating space from flowing back to an outside of the treating space.

The airflow supply unit 400 supplies a gas to form a downward airflow to the inner space of the housing 310. The airflow supply unit 400 is coupled to the top wall 311 of the housing 310. The gas supplied to the inner space of the housing 310 through the airflow supply unit 400 forms a downward airflow in the inner space. The gas by-products generated by the treatment process in the treating space are discharged to an outside of the housing 310 through the exhaust unit 380 by the downward airflow. The airflow supply unit 400 may be provided as a fan filter unit.

The perforated plate 500 uniformly discharges the gas supplied by the airflow supply unit 400 to the inner space of the housing 310. The perforated plate 500 is disposed between the airflow supply unit 400 and the treating container 320. The perforated plate 500 may be disposed at a height spaced apart from the airflow supply unit 400 and the treating container 320.

The perforated plate 500 has a bottom portion 510 and a side portion. The side portion extends from the bottom portion. The side portion includes a first side portion 520, a second side portion 530, a third side portion 540, and a fourth side portion 550. The first side portion 520 and the second side portion 530 are opposite to each other, and the third side portion 540 and the fourth side portion 550 are opposing each other. The first side portion 520 is adjacent the first sidewall 312 of the housing 310, and the second side portion 530 is adjacent the second sidewall 313 of the housing 310. In addition, the third side portion 540 is adjacent the third sidewall 314 of the housing 310, and the fourth side portion 550 is adjacent the fourth sidewall 315 of the housing 310.

The first side portion 520 extends from a respective side of the bottom portion 510 toward the first sidewall 312. The first side portion 520 may be upwardly inclined toward the first sidewall 312. The second side portion 530 extends from a respective side of the bottom portion 510 toward the second sidewall 313. The second side portion 530 may be upwardly inclined toward the second sidewall 313. The third side portion 540 extends from a respective side of the bottom portion 510 toward the third sidewall 314. The third side portion 540 may be upwardly inclined toward the third sidewall 314. The fourth side portion 550 extends from a respective side of the bottom portion 510 toward the fourth sidewall 315. The fourth side portion 550 may be upwardly inclined toward the fourth sidewall 315.

At least two side portions among the first side portion 520, the second side portion 530, the third side portion 540, and the fourth side portion 550 may be provided with different degree of inclination. According to an embodiment, the first side portion 520 is inclined less than the second side portion 530, the third side portion 540, and the fourth side portion 550. Namely, an angle between the first side portion 520 of the perforated plate and the first sidewall 312 of the housing may be greater than a respective angle between respective second to fourth side portions of the perforated plate and respective second to fourth sidewall of the housing. According to an embodiment, the degree of inclination A1 of the first side portion 520 may be provided smaller than the degree of inclination A2 of the second side portion 530. In other words, the angle between the first side portion 520 of the perforated plate and the first sidewall 312 of the housing may be greater than the angle between the second side portion 530 of the perforated plate and the second sidewall 313 of the housing The first side portion 520 has a first hole 521. The gas supplied from the airflow supply unit 400 is discharged to the inner space through the first hole 521. The first hole 521 is provided in a downwardly inclined direction toward the first sidewall 312 of the housing 310. Accordingly, the gas supplied from the airflow supply unit 400 may be directly discharged to an edge region in the inner space. A second hole 531 through which the gas supplied from the airflow supply unit 400 is discharged is formed in the second side portion 530. The second hole 531 may be provided to directly discharge the gas supplied from the airflow supply unit 400 in a downwardly inclined direction toward the second sidewall 313 of the housing 310. A third hole 541 through which the gas supplied from the airflow supply unit 400 is discharged is formed in the third side portion 540. The third hole 541 may be provided to directly discharge the gas supplied from the airflow supply unit 400 in a downwardly inclined direction toward the third sidewall 314 of the housing 310. A fourth hole 551 through which the gas supplied from the airflow supply unit 400 is discharged is formed in the fourth side portion 550. The fourth hole 551 may be provided to directly discharge the gas supplied from the airflow supply unit 400 in a downwardly inclined direction toward the fourth sidewall 315 of the housing 310. A bottom hole 511 through which the gas supplied from the airflow supply unit 400 is discharged is formed in the bottom portion 510.

The first hole 521, the second hole 531, the third hole 541, and the fourth hole 551 are formed in a portion of the perforated plate 500, for example the holes 521, 531, 541 and 551 may occupy 30% or less of the top surface of the perforated plate 500. The first hole 521, the second hole 531, the third hole 541, the fourth hole 551, and the bottom hole 511 may have a diameter of 4 mm to 12 mm. A distance between the perforated plate 500 and the airflow supply unit 400 may be 10 mm to 80 mm. The gas from the airflow supply unit 400 flows separately through the first hole 521, the second hole 531, the third hole 541, and the fourth hole 551 and descends down along the first sidewall 312, the second sidewall 313, the third sidewall 314, and the fourth sidewall 315, respectively, thereby preventing a collision between downward airflows in the inner space of the housing 310. As a result, an air flow interference in the inner space may be minimized.

The first to fourth holes 521, 531, 541 and 551 and the bottom hole 511 may be formed in the respective side portion and bottom portion to occupy different area in the top surface of the respective side portion and bottom portion, for example, the opening area of the holes per unit area of top surface of the respective side portion and bottom may be formed differently in at least two side portions and/or between side and bottom portions. For example, the opening area of the first hole 521 per unit area of a top surface of the first side portion 520 may be smaller than the opening area of the bottom hole 511 per unit area of a top surface of the bottom portion 510. An opening area of the second hole 531 per unit area of a top surface of the second side portion 530 may be smaller than an opening area of the bottom hole 511 per unit area of the top surface of the bottom portion 510 but larger than the opening area of the first hole 521 per unit area of the top surface of the first side portion 520. The first to fourth holes 521, 531, 541 and 551 may be formed in the respective side portion and bottom portion such that a distance between adjacent two holes in one side portion is different from a distance between two adjacent holes in another side portion and/or in the bottom portion. For example, a distance d1 between holes of the first hole 521, a distance d3 between holes of the second hole 531, a distance d4 between holes of the third hole 541, a distance d5 between holes of the fourth hole 551, and a distance d2 between holes of the bottom hole 511 are differently from one another. The distance d1 between holes of the first hole 521 may be provided smaller than the distance d2 between holes of the bottom hole 511. The distance d3 between holes of the second hole 531 may be provided to be greater than the distance d1 between holes of the first hole 521 and smaller than the distance d2 between holes of the bottom hole 511. The distance d4 between holes of the third hole 541 and the distance d5 between holes of the fourth hole 551 may be provided smaller than the distance d2 between holes of the bottom hole 511. Accordingly, a region having a far distance from the treating container 320 and the first sidewall 312 of the housing 310 may largely increase a downward airflow density compared to a region having a close distance from the treating container 320 and the second sidewall 313 of the housing 310.

Figure 6:
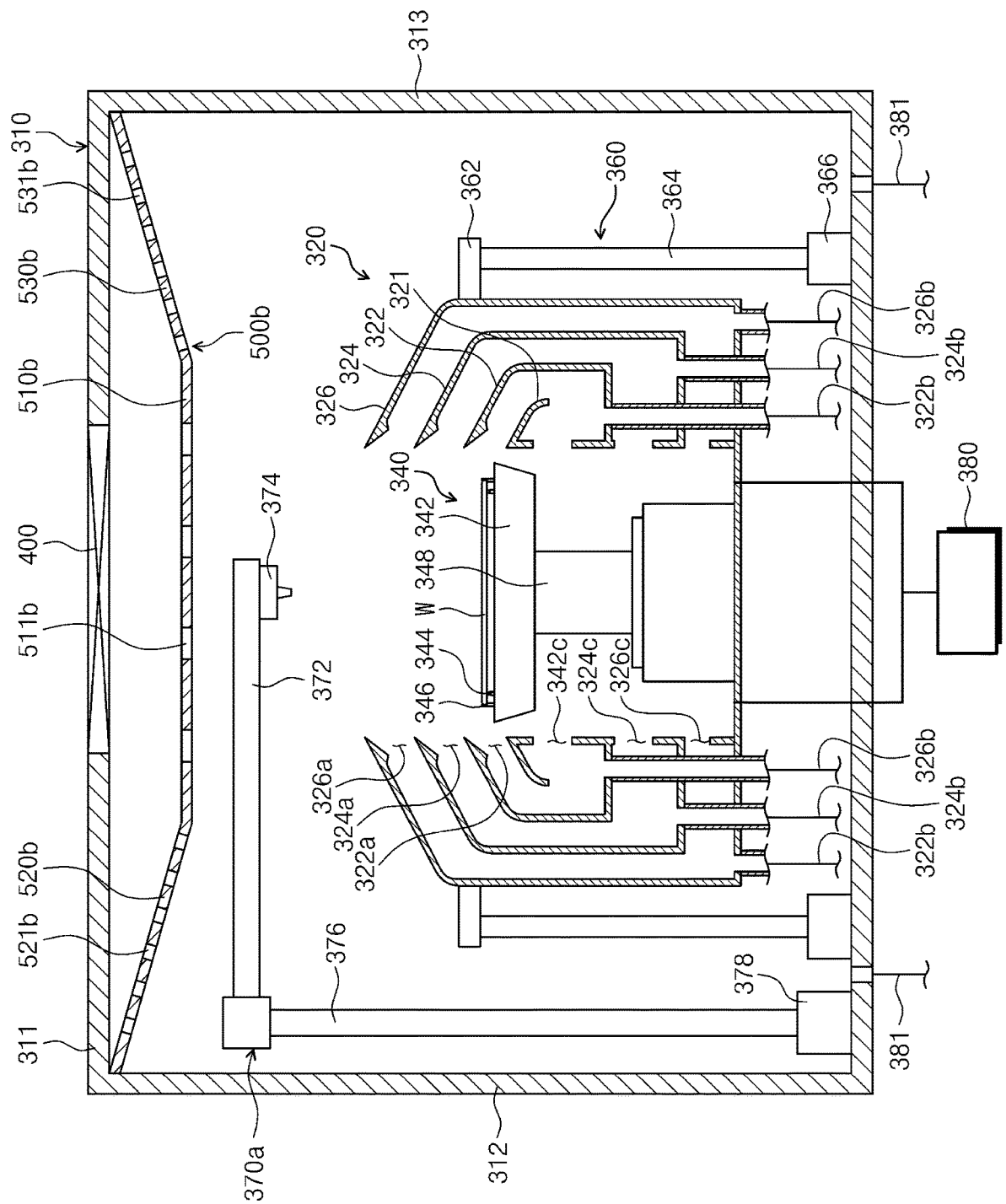
FIG. 6 to FIG. 8 are views schematically illustrating a modified example of the perforated plate of FIG. 3, respectively.

Unlike the aforementioned embodiment, the degree of inclination of the first side portion 520b may be provided to be equal to the degree of inclination of the second side portion 530b, as shown in FIG. 6, which shows a modified example of the perforated plate of FIG. 3. In some embodiments, the degree of inclinations of the first side portion 520b, the second side portion 530b, the third side portion 540b, and the fourth side portion 550b can be provided to be equal. In some embodiments, the degree of inclinations of the first side portion 520b and the second side portion 530b may be equal, and the degree of inclinations of the third side portion 540b and the fourth side portion 550b may be different from those of the first side portion 520b.

The first to fourth holes 521b, 531b, 541b and 551b may be formed in the respective side portion to occupy the same area in the top surface of the respective side portion, for example, the opening area of the holes per unit area of top surface of the respective side portion and bottom portion may be formed equally in the side portions. The opening area of the holes in all side portions may be provided to be smaller than an opening area of a bottom hole 511b per unit area of the top surface of the bottom portion 510b. The first to fourth holes 521b, 531b, 541b and 551b may be formed in the respective side portion and bottom portion such that a distance between adjacent two holes in one side portion is equal to a distance between two adjacent holes in another side portion. A distance between adjacent two hole in a given side portion may be different from a distance between adjacent two holes of the bottom hole 511b.

Figure 7:
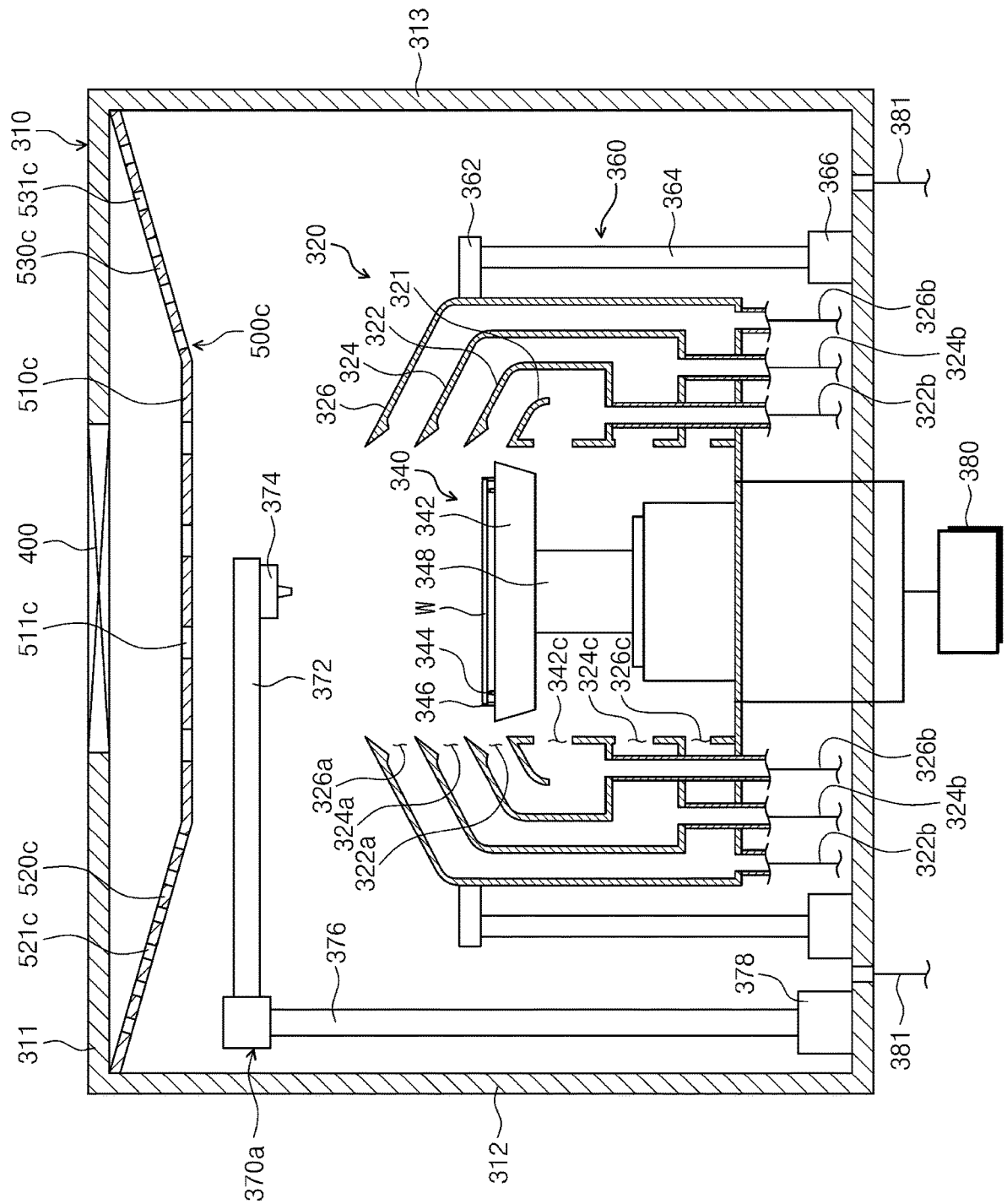

The degree of inclination of the first side portion 520c may be provided to be equal to the degree of inclination of the second side portion 530c, as shown in FIG. 7, unlike the aforementioned embodiment, which shows a modified example of the perforated plate of FIG. 3. In some embodiments, the degree of inclinations of the first side portion 520c, the second side portion 530c, the third side portion 540c, and the fourth side portion 550c may be provided to be equal. In some embodiments, the degree of inclinations of the first side portion 520c and the second side portion 530c may be equal, and the degree of inclinations of the third side portion 540c and the fourth side portion 550c may be differently from those of the first side portion 520c.

The opening areas of each hole per unit area of the top surface of first side portion 520c, the second side portion 530c, the third side portion 540c, the fourth side portion 550c, and the bottom portion 510c may be provided differently. In an embodiment, an opening area of the first hole 521c per unit area of the top surface of first side portion 520c may be provided smaller than an opening area of the bottom hole 511c per unit area of the top surface of bottom portion 510c. The opening areas of the second hole 531c, the third hole 541c, and the fourth hole 551c per unit area of the top surface of second side portion 530c, the third side portion 540c, and the fourth side portion 550c are smaller than the opening area of the bottom hole 511c per unit area of top surface of the bottom portion 510c, and larger than the opening area of the first hole 521c per unit area of the top surface of the first side portion 520c. In some embodiments, the opening area of the second hole 531c per unit area of the top surface of the second side portion 530c is larger than the opening area of the first hole 521c per unit area of the top surface of the first side portion 520c, and smaller than the opening area of top surface of the bottom hole 511c per unit area of the bottom portion 510c, the opening area of the third hole 541c per unit area of the top surface of the third side portion 540c, and the opening area of the fourth hold 551c per unit area of the top surface of the fourth side portion 550c.

The distances between the first hole 521c, the second hole 531c, the third hole 541c, the fourth hole 551c, and the bottom hole 511c can be provided differently. In an embodiment, a distance between holes of the first hole 521c may be smaller than a distance between holes of the bottom hole 511c. A distance between holes of the second hole 531c may be greater than a distance between the holes of the first hole 521c and smaller than a distance between the holes of the bottom hole 511c. A distance between the holes of the third hole 541c and a distance between holes of the fourth hole 551c may be smaller than a distance between holes of the bottom hole 511c.

Figure 8:
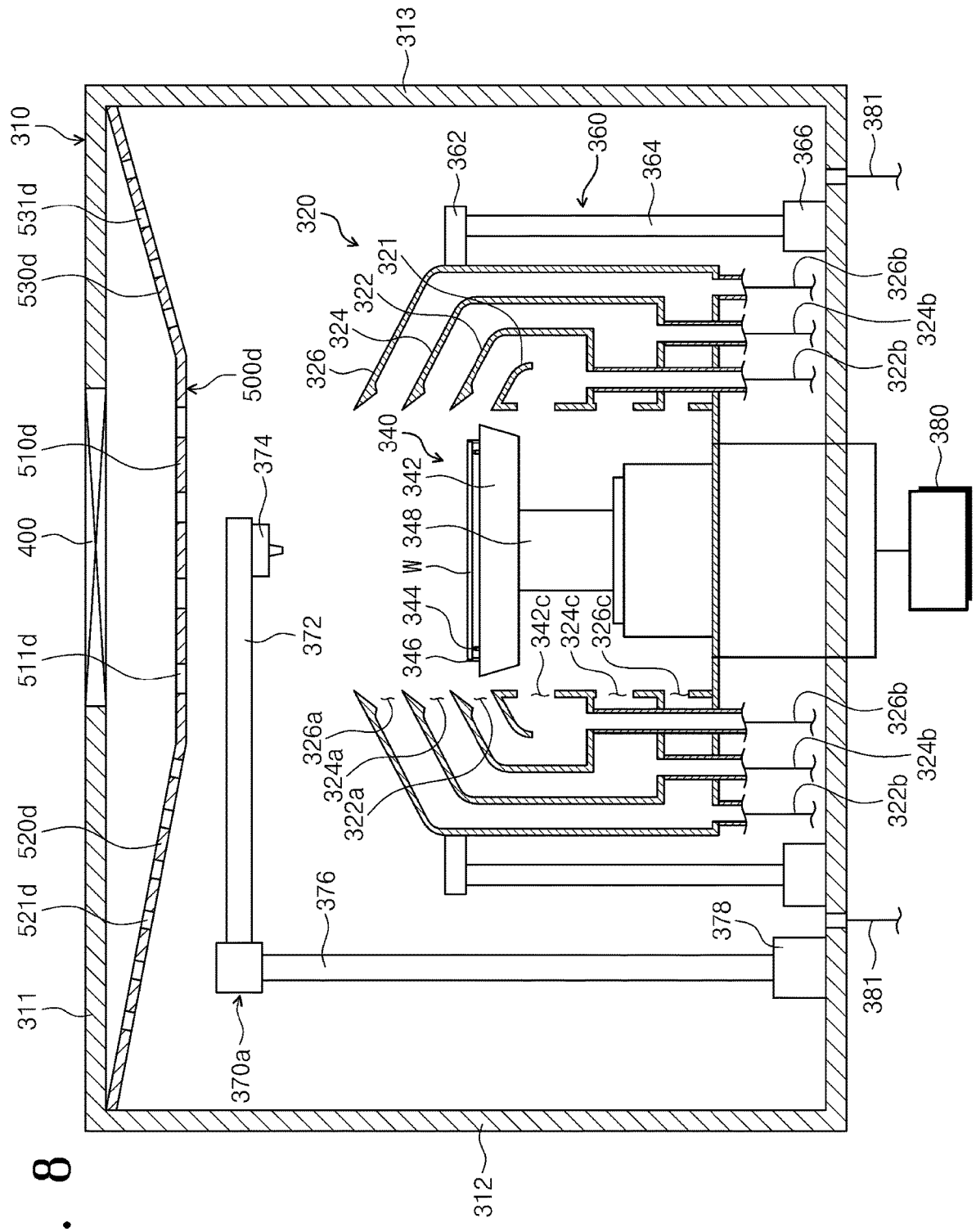

Unlike the above-described embodiment, the degree of inclinations of the first side portion 520d, the second side portion 530d, the third side portion 540d, and the fourth side portion 550d may be provided differently as shown in FIG. 8 showing a modified example of the perforated plate of FIG. 3. In an embodiment, the degree of inclination of the first side portion 520d may be provided smaller than the degree of inclination of the second side portion 530d, the third side portion 540d, and the fourth side portion 550d.

An opening area of the first hole 521d per unit area of the top surface of the first side portion 520d, an opening area of the second hole 531d per unit area of the top surface of the second side portion 530d, an opening area of the third hole 541d per unit area of the top surface of the third side portion 540d, and an opening area of the fourth hole 551d per unit area of the top surface of the fourth side portion 550d are the same, but smaller than an opening area of the bottom hole 511d per unit area of the top surface of the bottom portion 510d. A distance between the holes of the first hole 521d, the second hole 531d, the third hole 541d, and the fourth hole 551d may be provided to be the same, and may be different from a distance between the holes of the bottom hole 511d.

Figure 9:
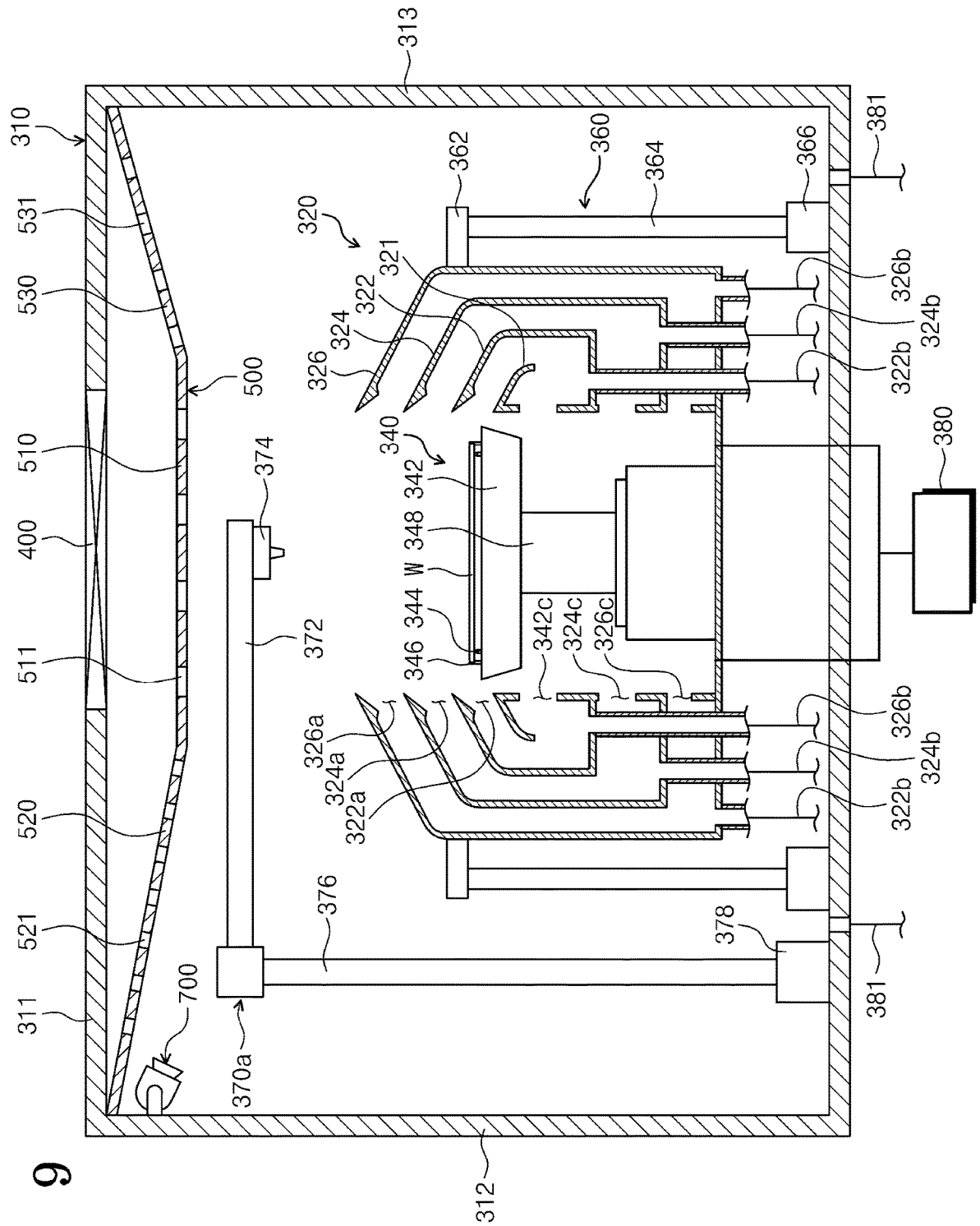
FIG. 9 is a view schematically illustrating another embodiment of the process chamber of FIG. 3.

FIG. 9 is a cross-sectional view schematically illustrating another embodiment of the process chamber of FIG. 3. FIG. 9 may further include an imaging unit 700 that provides the same process chamber 300 of an embodiment of FIG. 3 and acquires an image of an object. Referring to FIG. 9, the imaging unit 700 may image an object to be imaged in a downwardly inclined direction, i.e., an optical axis thereof forms an acute angle with respect to a horizontal plane, for example with respect to a plane defined by a top surface of the support unit or a plane defined by a top surface of a substrate supported by the support unit. In an embodiment, the object to be imaged may be a substrate supported by the substrate support unit 340 or a nozzle 374 of the liquid supply unit 370. The imaging unit 700 may be installed at the first sidewall 312 of the housing 310. The imaging unit 700 may be installed at the first sidewall of the housing adjacent a first end of the first side portion opposite a second end of the first side portion connected to the bottom portion. The first side portion 520 of the perforated plate 500 is provided as an inclined surface. The imaging unit 700 is installed at a position adjacent to the first side portion 520 of the perforated plate 500. The imaging unit 700 may be provided at a height corresponding to that of the first side portion 520. Accordingly, in a structure provided with a perforated plate for providing the downward airflow, an installation space of the imaging unit 700 may be ensured, an angle of view of the imaging unit 700 may be preserved, and at the same time, the downward airflow may be provided to the entire inner space.

Figure 10:
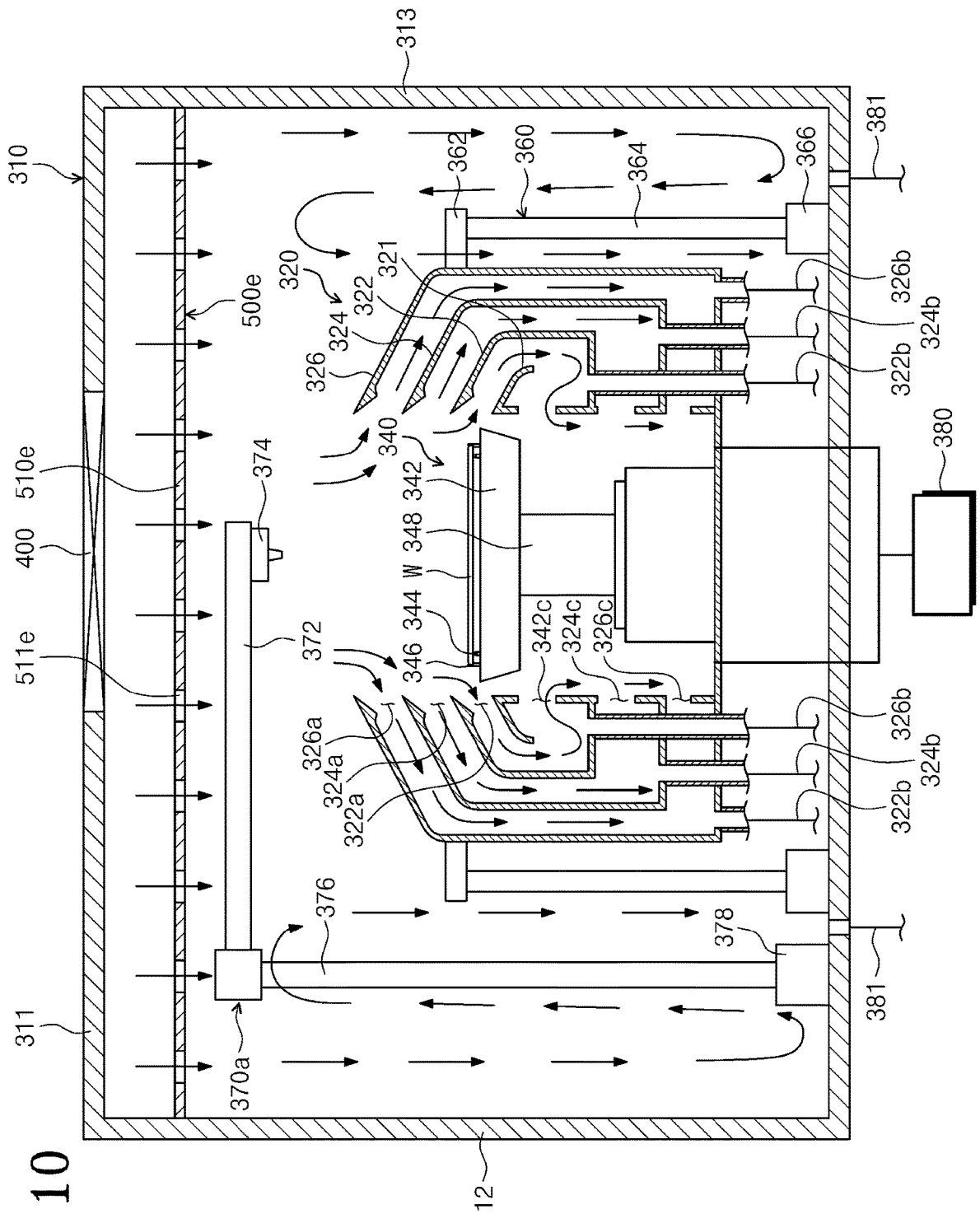
FIG. 10 is a view schematically illustrating a flow of an airflow inside the process chamber when the perforated plate does not have an inclined side surface and has only a bottom surface.
Figure 11:
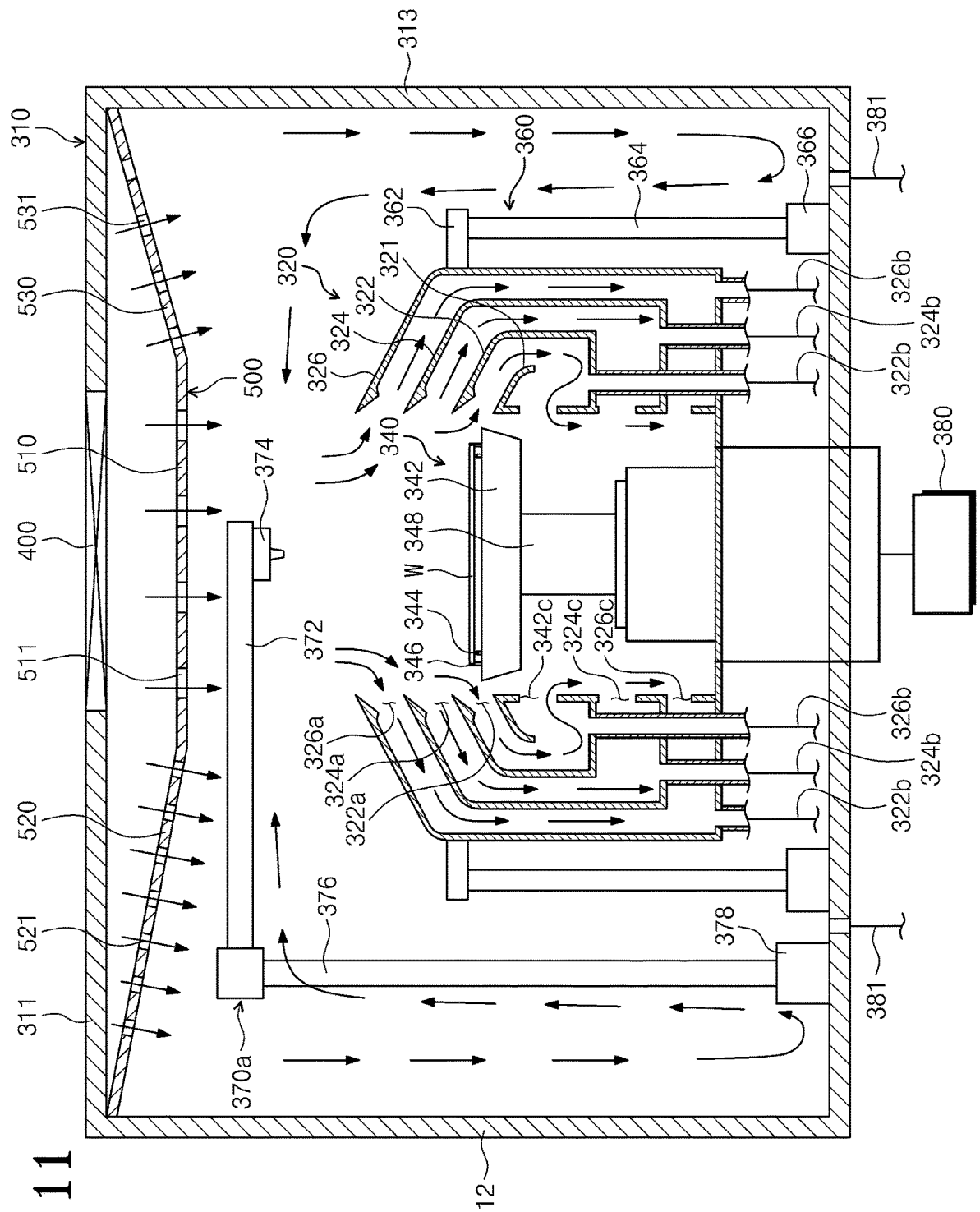
FIG. 11 is a view schematically illustrating the flow of an airflow flow inside the process chamber when the perforated plate has a bottom surface and an inclined side surface.

FIG. 10 and FIG. 11 schematically shows a flow of an airflow in the process chamber in the case that the perforated plate does not include an inclined side portion and has only a bottom portion, and in the case that the perforated plate has a bottom portion and an inclined side portion. The perforated plate 500 of the above-described embodiments is described as having an inclined side portion. When the perforated plate 500 has only the bottom portion without an inclined side portion, as shown in FIG. 10, the airflow is stagnated due to a collision between a downward airflow and an upward airflow coming after the downward airflow in an outer region of the treating container 320 in the inner space.

However, in the case that the perforated plate 500 has the bottom portion 510 and the inclined side portion according to exemplary embodiments of the inventive concept, a gas is discharged through the inclined side portion as shown in FIG. 11, thereby minimizing a collision between the downward air flow in the outer region of the treating container 320 and the upward air flow coming after the downward airflow. Therefore, the amount of downward airflow that may interfere with the upward airflow coming after the downward airflow in the outer region of the treating container 320 is small, and a stagnation of the airflow does not occur.

Figure 12:
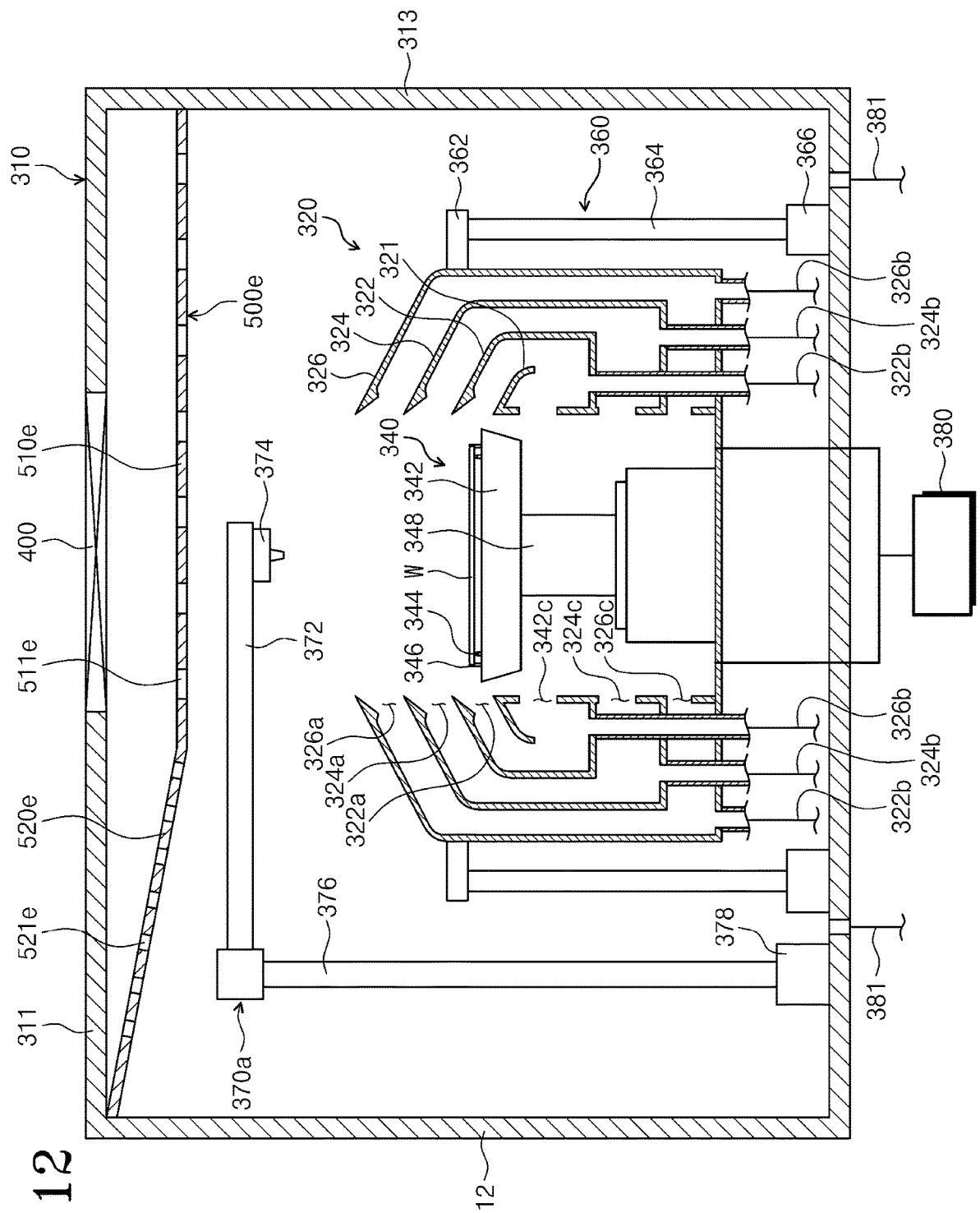
FIG. 12 is a view schematically illustrating another embodiment of the process chamber of the substrate treating apparatus of FIG. 2.

FIG. 12 schematically shows another embodiment of the process chamber of FIG. 2. Referring to FIG. 12, the perforated plate 500e has a bottom portion 510e and a side portion. The side portion has a first side portion 520e adjacent the first sidewall 312 of the housing 310. The first side portion 520e extends from a respective side of the bottom portion 510e toward the first sidewall 312. The first side portion 520e is provided to be upwardly inclining toward the first sidewall 312 as it faces upward.

A first hole 521 is formed at the first side portion 520e. The gas supplied from the airflow supply unit 400 is discharged to the inner space through the first hole 521e. The first hole 521e is provided in a downwardly inclined direction toward the first sidewall 312 of the housing 310. Accordingly, the gas supplied from the airflow supply unit 400 may be directly discharged to the edge area within the inner space. A bottom hole 511e is formed at the bottom portion 510e. The gas supplied from the airflow supply unit 400 may be directly discharged toward the treating space through the bottom hole 511e.

An opening area of the first hole 521e per unit area of a top surface of the first side portion 520e is provided differently from an opening area of the bottom hole 511e per unit area of a top surface of the bottom portion 510e. The bottom hole 511e and the first hole 521e are formed in respective bottom and side portion to occupy in a portion of the perforated plate 500, for example the holes 511e and 521e may occupy 30% or less of the top surface of the perforated plate 500e. A distance between the perforated plate 500e and the airflow supply unit 400 may be 10 mm to 80 mm. The first hole 521e and the bottom hole 511e may have diameters ranging from 4 mm to 12 mm. A gas discharged by the first hole 521e formed at the inclined first side portion 520e downwardly flows along the first sidewall 312, thereby minimizing an airflow interference due to the downward airflow in the inner space of the housing 310.

Figure 13:
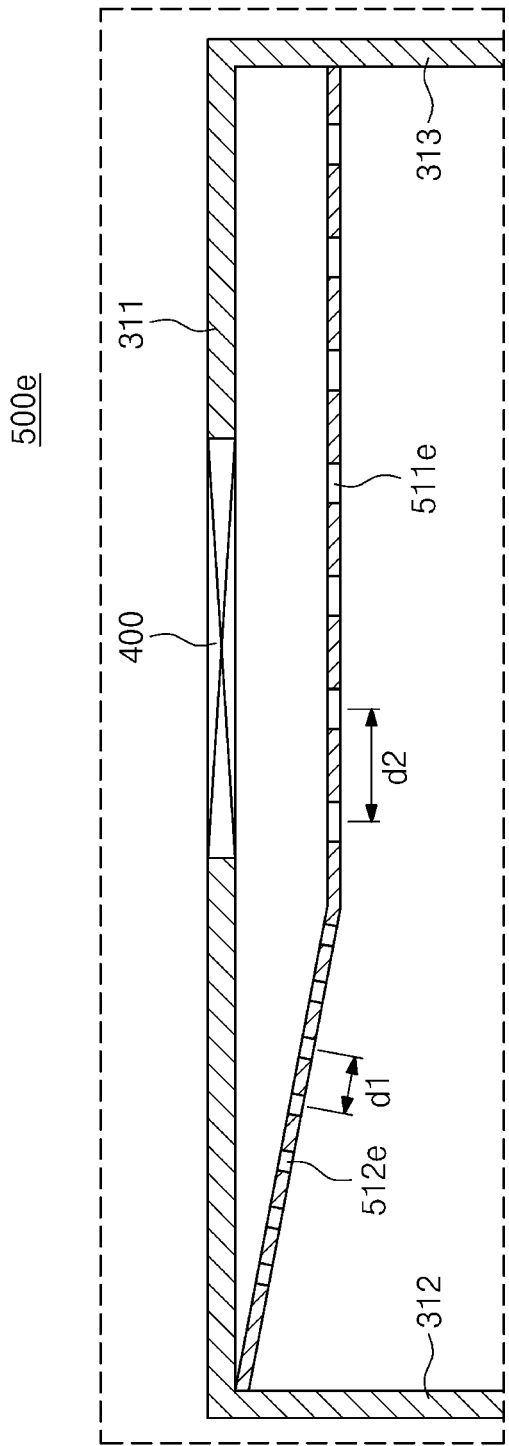
FIG. 13 is a view schematically showing the perforated plate of FIG. 12.

FIG. 13 schematically shows the perforated plate of FIG. 12. Referring to FIG. 13, the opening area of the first hole 521e per unit area of the top surface of the first side portion 520e may be provided smaller than the opening area of the bottom hole 511e per unit area of the top surface of the bottom portion 510e. A distance d1 between holes of the first hole 521e is provided to be smaller than a distance d2 between holes of the bottom hole 511e. Accordingly, a downward airflow density may be relatively large in a region adjacent to the first sidewall 312 having a relatively large inner space. In some embodiments, the opening area of the first hole 521e per unit area of the top surface of the first side portion 520e may be provided equal to the opening area of the bottom hole 511e per unit area of the top surface of the bottom portion 510e. In some embodiments, the distance d1 between holes of the first hole 521e and the distance d2 between holes of the bottom hole 511e may be provided to be the same.

Figure 14:
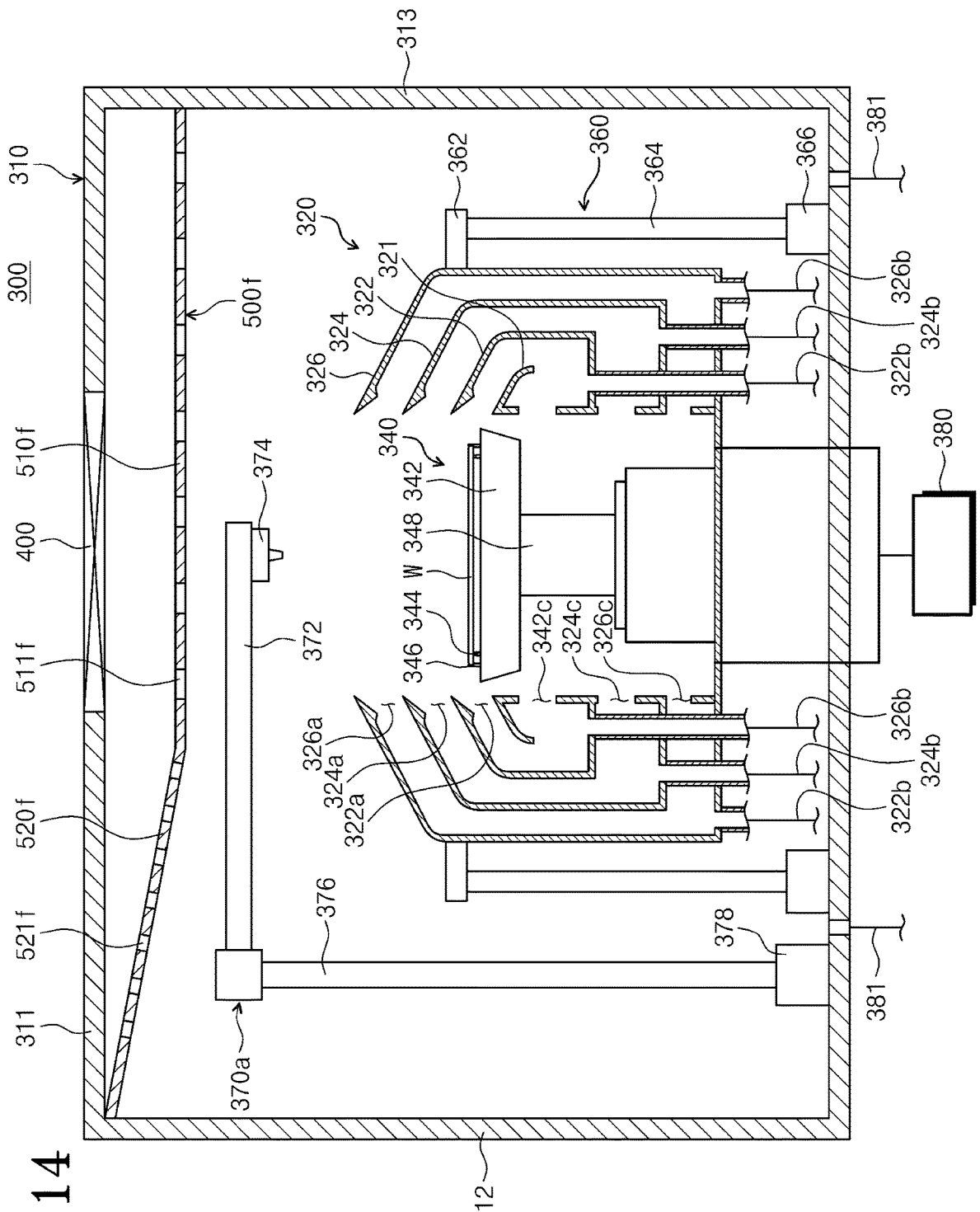
FIG. 14 is a view schematically illustrating another embodiment of the process chamber of the substrate treating apparatus of FIG. 2.

FIG. 14 schematically shows another embodiment of the process chamber of FIG. 2. Referring to FIG. 14, the perforated plate 500f uniformly discharges the gas supplied by the airflow supply unit 400 to the inner space of the housing 310. The perforated plate 500f is spaced downward from the airflow supply unit 400 and is disposed above the treating container 320. The perforated plate 500f has a bottom portion 510f and a side portion. The side portion has a first side portion 520f adjacent the first sidewall 312 of the housing 310. The first side portion 520f extends from a respective side of the bottom portion 510f toward the first sidewall 312. The first side portion 520f is provided to be upwardly inclining toward the first sidewall 312. The remainder sides of the bottom portion 510f except the side connected to the first side portion 520f are in contact with the second sidewall 313, the third sidewall 314, and the fourth sidewall 315 of the housing 310.

A first hole 521f through which the gas supplied from the airflow supply unit 400 is discharged is formed in the first side portion 520f. The first hole 521f may be provided to directly discharge the gas supplied from the airflow supply unit 400 in a downwardly inclined direction toward the first sidewall 312 of the housing 310. A bottom hole 511f through which the gas supplied from the airflow supply unit 400 is discharged is formed in the bottom portion 510f. The bottom hole 511f and the first hole 521f are formed in respective bottom and side portion to occupy in a portion of the perforated plate 500f, for example the holes 511f and 521f may occupy 30% or less of the top surface of the perforated plate 500f. The first hole 521f and the bottom hole 511f may have diameters ranging from 4 mm to 12 mm. A distance between the perforated plate 500f and the airflow supply unit 400 may be formed to be 10 mm to 80 mm. By the discharged gas from the first hold 52 going downward along the first sidewall 312, an air flow interference due to downward airflow in the inner space of the housing 310 may be minimized.

The opening area of the first hole 521*f* per unit area of the top surface of the first side portion 520*f* is provided differently from the opening area of the bottom hole 511*f* per unit area of the top surface of the bottom portion 510*f*. In an embodiment, the opening area of the first hole 521*f* per unit area of the top surface of the first side portion 520*f* may be provided smaller than the opening area of the bottom hole 511*f* per unit area of the top surface of the bottom portion 510*f*. The distance between holes of the first hole 521*f* is provided smaller than the distance between holes of the bottom hole 511*f*. The downward airflow density may be relatively large in an area adjacent to the first sidewall 312 having a relatively large inner space.

In the above-described embodiment, a case in which the perforated plate has the first side portion and a case in which the perforated plate has the first side portion, the second side portion, the third side portion, and the fourth side portion are all provided as examples. However, unlike this, the side portions of the perforated plate may have two or three side portions. In the above-described embodiment, the opening area and the distance of the hole formed in the perforated plate have been described in various embodiments, but the embodiment of the inventive concept is not limited thereto and may be variously modified.

Figure 15:
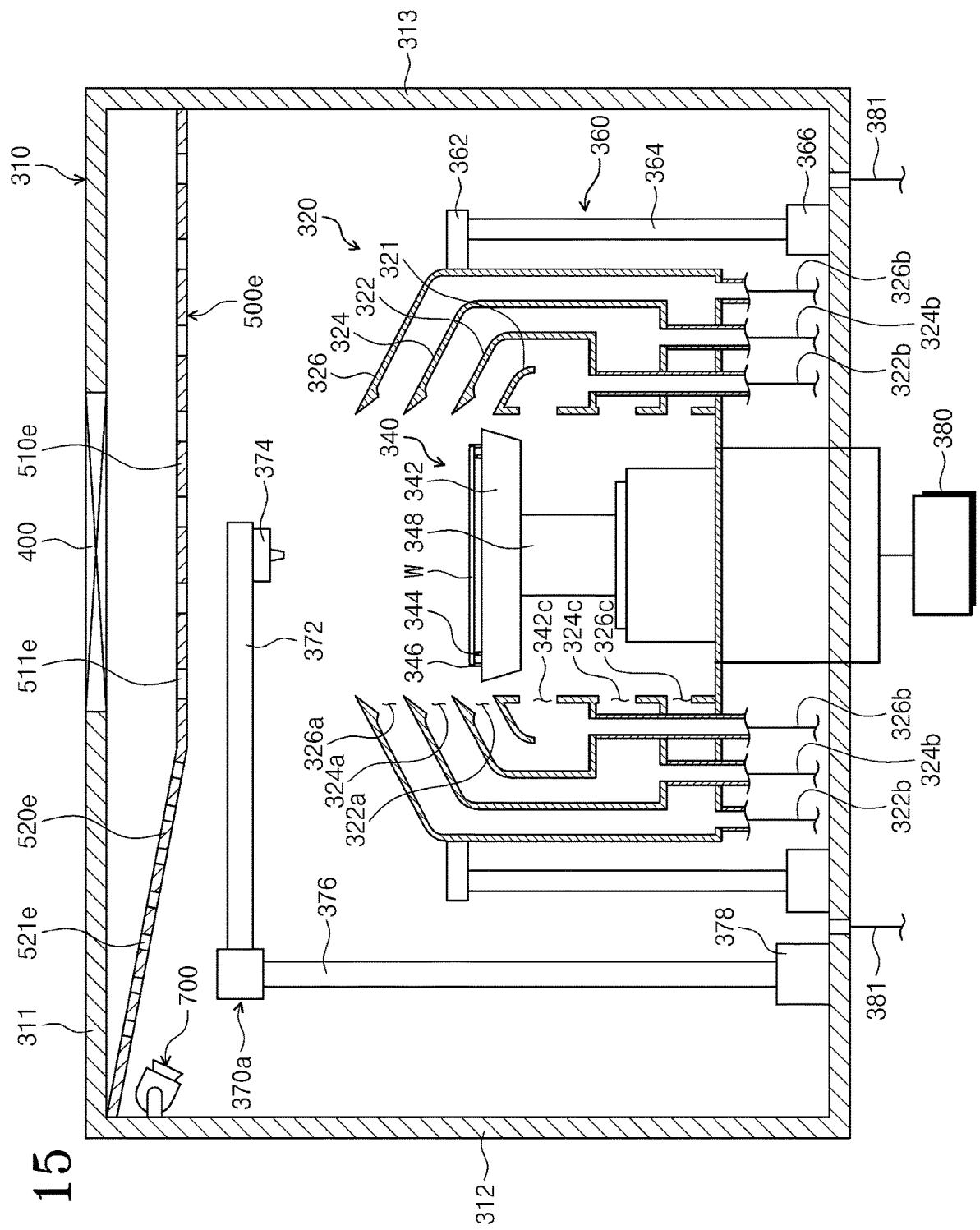
FIG. 15 is a view schematically illustrating another embodiment of the process chamber of FIG. 12.

FIG. 15 schematically shows another embodiment of the process chamber of FIG. 12. FIG. 15 may further include an imaging unit 700 that provides the same process chamber 300 of an embodiment of FIG. 12 and acquires an image of an object to be imaged through imaging. Referring to FIG. 15, the imaging unit 700 may image an object to be imaged in a downwardly inclined direction, i.e., an optical axis thereof forms an acute angle with respect to a horizontal plane, for example with respect to a plane defined by a top surface of the support unit or a plane defined by a top surface of a substrate supported by the support unit. In an embodiment, the imaging unit 700 may image a substrate supported by the substrate support unit 340 or a nozzle 374 of the liquid supply unit 370 as an object to be imaged. The imaging unit 700 may be installed on the first sidewall 312 of the housing 310. The imaging unit 700 may be installed at the first sidewall of the housing adjacent a first end of the first side portion opposite a second end of the first side portion connected to the bottom portion. The imaging unit 700 may be provided at a height corresponding to an inclined surface of the first side portion 520*e* at a position adjacent to the first side portion 520*e* of the perforated plate 500*e*. Accordingly, in a structure provided with the perforated plate for providing the downward airflow, an installation space of the imaging unit 700 may be ensured, an angle of view of the imaging unit 700 may be preserved, and at the same time, the downward airflow may be provided to the entire inner space.

Figure 16:
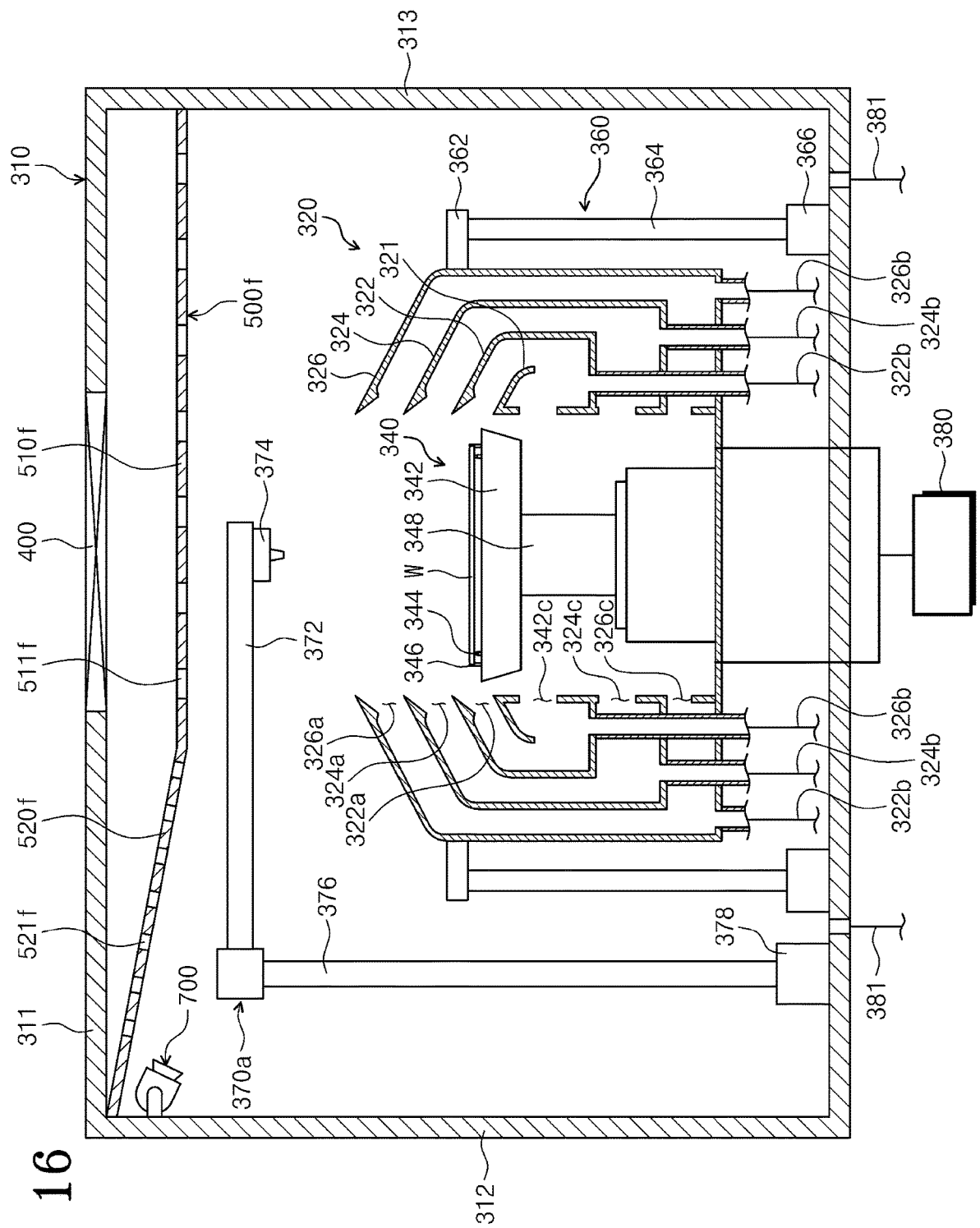
FIG. 16 is a view schematically illustrating another embodiment of the process chamber of FIG. 14.

FIG. 16 schematically shows another embodiment of the process chamber of FIG. 14. FIG. 16 may further include an imaging unit 700 that provides the same process chamber 300 of an embodiment of FIG. 14 and acquires an image of an object to be imaged through imaging. Referring to FIG. 16, the imaging unit 700 may image an object to be imaged in a downwardly inclined direction, i.e., an optical axis thereof forms an acute angle with respect to a horizontal plane, for example with respect to a plane defined by a top surface of the support unit or a plane defined by a top surface of a substrate supported by the support unit. In an embodiment, the imaging unit 700 may image a substrate supported by the substrate support unit 340 or a nozzle 374 of the liquid supply unit 370 as an object to be imaged. The imaging unit 700 may be installed at the first sidewall 312 of the housing 310. The imaging unit 700 may be installed at the first sidewall of the housing adjacent a first end of the first side portion opposite a second end of the first side portion connected to the bottom portion. The imaging unit 700 may be provided at a height corresponding to an inclined surface of the first side portion 520*f* at a position adjacent to the first side portion 520*f* of the perforated plate 500*f*. Accordingly, in a structure provided with the perforated plate for providing the downward airflow, an installation space of the imaging unit 700 may be ensured, an angle of view of the imaging unit 700 may be preserved, and at the same time, the downward airflow may be provided to the entire inner space.

The effects of the inventive concept are not limited to the above-mentioned effects, and the unmentioned effects can be clearly understood by those skilled in the art to which the inventive concept pertains from the specification and the accompanying drawings. Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be a downward airflow density construed separately from the technical spirit or prospect of the inventive concept.

What is claimed is:

1. A substrate treating apparatus comprising: a housing having an inner space therein; a treating container disposed within the inner space and having a treating space; a substrate support unit supporting a substrate in the treating space; a liquid supply unit supplying a liquid to the substrate supported by the substrate support unit; an exhaust unit exhausting a byproduct generated in the treating space from a cleaning process using the liquid; an airflow supply unit coupled to a top side of the housing and supplying a downward airflow of a gas to the inner space of the housing; and a perforated plate disposed between the treating container and the airflow supply unit and discharging the gas to the inner space, wherein the perforated plate comprises: a bottom portion and a side portion, wherein the side portion comprises: a first side portion extending in an upwardly inclined direction from a first end of the bottom portion toward an uppermost-end of a first sidewall of the housing, and having a plurality of first holes for discharging the gas to the inner space of the housing, wherein the first side portion is connected to the uppermost end of the first sidewall of the housing, wherein the bottom portion of the perforated plate has a plurality of bottom holes for discharging the gas to the inner space of the housing, and wherein the plurality of first holes are spaced apart from each other at a first distance, wherein the plurality of bottom holes are spaced apart from each other at a second distance different from the first distance.

2. The substrate treating apparatus of claim 1, wherein the first distance is smaller than the second distance.

3. The substrate treating apparatus of claim 1, wherein the plurality of first holes are configured to discharge a portion of the gas toward the first sidewall of the housing, and wherein the discharged portion of the gas flows downwardly in an inclined direction toward the first sidewall of the housing.

4. The substrate treating apparatus of claim 1,
wherein the side portion of the perforated plate further comprises:
a second side portion having a second hole for discharging the gas,
wherein the second side portion is opposite to the first side portion,
wherein the bottom portion connects the first side portion and the second side portion with each other, and
wherein the second side portion extends in an upwardly inclined direction from a second end of the bottom portion to an uppermost portion of a second sidewall of the housing, the second sidewall of the housing opposite to the first sidewall of the housing.

5. The substrate treating apparatus of claim 4,
wherein a first angle between the first side portion of the perforated plate and the first sidewall of the housing is different from a second angle between the second side portion of the perforated plate and the second sidewall of the housing.

6. The substrate treating apparatus of claim 5,
wherein the first angle is greater than the second angle,
wherein an opening area of each of the plurality of first holes per unit area of the first side portion is smaller than an opening area of each of the plurality of bottom holes per unit area of the bottom portion, and
wherein an opening area of the second hole per unit area of the second side portion is smaller than the opening area of each of the plurality of bottom holes per unit area of a top surface of the bottom portion and larger than the opening area of each of the plurality of first holes per unit area of a top surface of the first side portion.

7. The substrate treating apparatus of claim 4,
wherein the side portion of the perforated plate further comprises:
a third side portion between the first side portion and the second side portion and having a third hole for discharging the gas; and
a fourth side portion opposite to the third side portion and between the first side portion and the second side portion and having a fourth hole for discharging the gas, and
wherein the third side portion extends in an upwardly inclined direction from the bottom portion to a third sidewall of the housing, and
wherein the fourth side portion extends in an upwardly inclined direction from the bottom portion to a fourth sidewall of the housing.

8. The substrate treating apparatus of claim 7,
wherein an angle between the first side portion of the perforated plate and the first sidewall of the housing is greater than respective angles between respective second to fourth side portions of the perforated plate and respective second to fourth sidewalls of the housing, and
wherein an opening area of each of the plurality of first holes per unit area of the first side portion is smaller than an opening area of each of the plurality of bottom holes per unit area of the bottom portion, and
wherein respective opening areas of the second to fourth holes per respective unit areas of the second to fourth side portions is smaller than the opening area of each of the plurality of bottom holes per unit area of the bottom portion and larger than the opening area of each of the plurality of first holes per unit area of the first side portion.

9. The substrate treating apparatus of claim 1,
wherein the side portion of the perforated plate comprises a plurality of side portions including the first side portion, and
wherein the plurality of side portions are in contact with respective sidewalls of the housing.

10. The substrate treating apparatus of claim 1,
wherein the airflow supply unit comprises:
a filter for removing impurities from the gas flowing thereinto; and
a fan disposed at a top surface of the housing for forming a downward airflow in the inner space.

11. The substrate treating apparatus of claim 1,
wherein the substrate treating apparatus further comprising:
an imaging unit installed at the first sidewall of the housing adjacent a first end of the first side portion opposite a second end of the first side portion connected to the bottom portion, the imaging unit being installed such that an optical axis thereof forms an acute angle with respect to a horizontal plane.

12. A substrate treating apparatus comprising:
a housing having an inner space and including a first sidewall and a second sidewall;
a treating container disposed within the inner space and having a treating space;
a substrate support unit supporting a substrate in the treating space;
a liquid supply unit supplying a liquid to the substrate supported by the substrate support unit;
an exhaust unit exhausting a byproduct generated in the treating space from a cleaning process using the liquid;
an airflow supply unit coupled to a top side of the housing and supplying a gas to form a downward airflow to the inner space; and
a perforated plate disposed between the treating container and the airflow supply unit, and discharging the gas to the inner space of the housing, and
wherein the perforated plate comprises:
a bottom portion having a plurality of bottom holes for discharging the gas in a direction perpendicular to a top surface of the substrate supported by the substrate support unit; and
a first side portion extending upwardly from the bottom portion to a first sidewall of the housing, and having a plurality of first holes for discharging the gas toward the first sidewall of the housing,
wherein the plurality of first holes are spaced apart from each other at a first distance,
wherein the plurality of bottom holes are spaced apart from each other at a second distance different from the first distance, and
wherein the first distance is smaller than the second distance.

13. The substrate treating apparatus of claim 12,
wherein an opening area of the plurality of first holes per unit area of a top surface of the first side portion is smaller than an opening area of the plurality of bottom holes per unit area of a top surface of the bottom portion.

14. The substrate treating apparatus of claim 13,
wherein the perforated plate includes a second side portion extending in an upwardly inclined direction from the bottom portion to a second sidewall of the housing, and having a plurality of second holes for discharging the gas toward the second sidewall of the housing, and wherein an angle between the first side portion and the first sidewall is greater than an angle between the second side portion and the second sidewall, and wherein an opening area of the plurality of second holes per unit area of the second side portion is smaller than an opening area of the plurality of bottom holes per unit area of the bottom portion and larger than an opening area of the plurality of first holes per unit area of the first side portion.

15. The substrate treating apparatus of claim 12, wherein the substrate treating apparatus further comprising:

an imaging unit installed at the first sidewall of the housing adjacent a first end of the first side portion opposite a second end of the first side portion connected to the bottom portion, the imaging unit installed such that an optical axis thereof forms an acute angle with respect to a horizontal plane defined by a top surface of the substrate support unit.

16. A substrate treating apparatus comprising:

a housing having an inner space and including a first sidewall, a second sidewall, a third sidewall, and a fourth sidewall;

a treating container disposed within the inner space and having a treating space;

a substrate support unit supporting a substrate in the treating space;

a liquid supply unit supplying a liquid to the substrate supported by the substrate support unit;

an exhaust unit exhausting a byproduct generated in the treating space;

an airflow supply unit coupled to a top side of the housing and supplying a gas to form a downward airflow to the inner space; and a perforated plate disposed between the treating container and the airflow supply unit, and discharging the gas to the inner space, and wherein the perforated plate comprises:

a bottom portion including a plurality of bottom holes for discharging the gas in a direction perpendicular to a top surface of the substrate supported by the substrate support unit; and a first side portion upwardly extending from the bottom portion to the first sidewall of the housing, and having a plurality of first holes for discharging the gas toward the first sidewall of the housing, wherein the plurality of first holes are spaced apart from each other at a first distance, wherein the plurality of bottom holes are spaced apart from each other at a second distance different from the first distance, and wherein the first distance is smaller than the second distance.

17. The substrate treating apparatus of claim 16, wherein the perforated plate further includes a second side portion, a third side portion, and a fourth side portion extending in an upwardly inclined direction from the bottom portion to the second sidewall, the third sidewall and the fourth sidewall, respectively and wherein angle between the first side portion of the perforated plate and a first sidewall of the housing is greater than respective angles between respective second to fourth side portions of the perforated plate and respective second to fourth sidewalls of the housing.

18. The substrate treating apparatus of claim 17, wherein respective opening areas of a plurality of second holes, a plurality of third holes, a plurality of fourth holes per respective unit areas of top surfaces of the second to fourth side portions is greater than an opening area of the plurality of first holes per unit area the top surface of the first side portion.

19. The substrate treating apparatus of claim 16, wherein the substrate treating apparatus further comprising:

an imaging unit installed at a first sidewall of the housing adjacent a first end of the first side portion opposite a second end of the first side portion connected to the bottom portion, the imaging unit installed such that an optical axis thereof forms an acute angle with respect to a horizontal plane defined by a top surface of the substrate support unit.

* * * * *